US010623123B2

(12) United States Patent
Stein et al.

(10) Patent No.: US 10,623,123 B2
(45) Date of Patent: Apr. 14, 2020

(54) VIRTUAL HDBASET LINK

(71) Applicant: Valens Semiconductor Ltd., Hod Hasharon (IL)

(72) Inventors: Shai Stein, Hod Hasharon (IL); Eran Rippel, Herzliya (IL)

(73) Assignee: Valens Semiconductor Ltd., Hod Hasharon (IL)

( * ) Notice: Subject to any disclaimer, the term of this patent is extended or adjusted under 35 U.S.C. 154(b) by 110 days.

(21) Appl. No.: 15/890,245

(22) Filed: Feb. 6, 2018

(65) Prior Publication Data

US 2018/0227068 A1 Aug. 9, 2018

Related U.S. Application Data

(60) Provisional application No. 62/455,519, filed on Feb. 6, 2017.

(51) Int. Cl.
*H04J 3/06* (2006.01)
*H04N 21/43* (2011.01)
(Continued)

(52) U.S. Cl.
CPC ......... *H04J 3/0667* (2013.01); *H03M 13/118* (2013.01); *H03M 13/1165* (2013.01); *H03M 13/1168* (2013.01); *H03M 13/1185* (2013.01); *H03M 13/2921* (2013.01); *H04J 3/067* (2013.01); *H04J 3/0664* (2013.01);
(Continued)

(58) Field of Classification Search
CPC ......... H03M 13/1165; H03M 13/1168; H03M 13/118; H04J 3/0667; H04J 3/0673; H04J 3/0697; H04J 3/067
See application file for complete search history.

(56) References Cited

U.S. PATENT DOCUMENTS 5,640,388 A 6/1997 Woodhead et al.
6,381,660 B1 4/2002 Ito
(Continued)

OTHER PUBLICATIONS

Elson, Jeremy, Lewis Girod, and Deborah Estrin. "Fine-grained network time synchronization using reference broadcasts." ACM SIGOPS Operating Systems Review 36.SI (2002): 147-163.
(Continued)

*Primary Examiner* — Edan Orgad
*Assistant Examiner* — Nourali Mansoury
(74) *Attorney, Agent, or Firm* — Active Knwoledge Ltd.

(57) ABSTRACT

Methods and systems for providing a virtual HDBaseT® link. In one embodiment, a first switch transmits packets over an Ethernet network that includes one or more hops. The payload of each of the packets includes an HDBaseT® T-packet belonging to an HDBaseT® session. A first processor sets, for each packet from among a plurality of the packets, a timestamp value in the packet to correspond to the time at which the packet is transmitted by the first switch. A second switch receives the packets over the Ethernet network. A second processor calculates a clock correction value based on the timestamps in the plurality of packets, and utilizes the clock correction value to perform at least one of the following: (i) control transmission, by the second switch, of data in T-packets in the payloads of the packets, and (ii) recover a source clock of native media delivered over the Ethernet network.

34 Claims, 13 Drawing Sheets

(51) Int. Cl.
*H04L 12/40* (2006.01)
*H03M 13/11* (2006.01)
*H03M 13/29* (2006.01)
*H04L 1/00* (2006.01)
*H04L 1/18* (2006.01)
*H04N 21/4363* (2011.01)

(52) U.S. Cl.
CPC .......... *H04J 3/0673* (2013.01); *H04J 3/0697* (2013.01); *H04L 1/0057* (2013.01); *H04L 1/0063* (2013.01); *H04L 1/0083* (2013.01); *H04L 12/40* (2013.01); *H04L 12/40013* (2013.01); *H04N 21/4305* (2013.01); *H04L 1/005* (2013.01); *H04L 1/0061* (2013.01); *H04L 1/1812* (2013.01); *H04L 1/1835* (2013.01); *H04N 21/43635* (2013.01)

(56) References Cited

U.S. PATENT DOCUMENTS

| | | | |
|---|---|---|---|
| 6,598,172 | B1 | 7/2003 | VanDeusen et al. |
| 7,397,877 | B2 | 7/2008 | Miao |
| 7,768,931 | B2 | 8/2010 | Golparian |
| 8,320,412 | B2 | 11/2012 | Li |
| 8,442,074 | B1 | 5/2013 | Goodson et al. |
| 8,494,009 | B2 | 7/2013 | Fourcand |
| 8,804,762 | B2 | 8/2014 | Thompson |
| 8,959,381 | B2 | 2/2015 | Aweya et al. |
| 9,294,265 | B2 | 3/2016 | Thomas et al. |
| 2003/0169776 | A1* | 9/2003 | Reesor .................. H04J 3/0632 370/503 |
| 2003/0179780 | A1 | 9/2003 | Walker et al. |
| 2006/0203851 | A1 | 9/2006 | Eidson |
| 2006/0269029 | A1* | 11/2006 | Repko .................. H04J 3/0664 375/356 |
| 2008/0285476 | A1* | 11/2008 | Rajakarunanayake ...................... H04L 1/0045 370/252 |
| 2010/0085989 | A1 | 4/2010 | Belhadj et al. |
| 2010/0158183 | A1* | 6/2010 | Hadzic .................. H03L 7/087 375/376 |
| 2010/0293243 | A1 | 11/2010 | Wittwer |
| 2011/0035511 | A1 | 2/2011 | Biederman |
| 2011/0158120 | A1* | 6/2011 | Hamasaki ............. H04J 3/0641 370/252 |
| 2015/0318940 | A1* | 11/2015 | Bugenhagen ......... H04J 3/0632 370/509 |

OTHER PUBLICATIONS

Ferrant, Jean-Loup, et al. "Development of the first IEEE 1588 telecom profile to address mobile backhaul needs." *IEEE Communications Magazine* 48.10 (2010).

Fober, Dominique, Y. Orlarey, and S. Letz. "Clock skew compensation over a high latency network." Proceedings of the ICMC. 2002.

Iantosca, Carmelo, Christoph Heitz, and Hans Weibel. "Synchronizing IEEE 1588 clocks under the presence of significant stochastic network delays." Conference on IEEE. vol. 1588. 2005.

Kusy, Branislav, et al. "Elapsed time on arrival: a simple and versatile primitive for canonical time synchronisation services." International Journal of Ad Hoc and Ubiquitous Computing 1.4 (2006): 239-251.

Syed, Affan A., and John S. Heidemann "Time Synchronization for High Latency Acoustic Networks." Infocom. vol. 6. 2006.

Weibel, Hans. "High precision clock synchronization according to IEEE 1588 implementation and performance issues." *Proc. Embedded World* 2005 (2005): 96.

* cited by examiner

VIRTUAL HDBASET LINK

CROSS-REFERENCE TO RELATED APPLICATIONS

This application claims priority to U.S. Provisional Patent Application No. 62/455,519, filed Feb. 6, 2017.

BACKGROUND

HDBaseT® is a connectivity standard that enables the use of a single category cable to offer HD video, audio, Ethernet, controls, USB 2.0 and power. Transmission of data according to the HDBaseT® standard comes with several benefits that include time-sensitive transmissions, low delays and low latency. Legacy Ethernet networks are widely deployed, in both the consumer and industrial settings. Thus, it would be advantageous to utilize Ethernet networks to extend the scope of HDBaseT® networks. For example, this could extend HDBaseT® from in-room to cross-campus applications, and leverage existing pro-AV installations and interfaces to achieve end-to-end system optimization and reduced total cost of ownership.

However, HDBaseT® is based on a different protocol that basic Ethernet network equipment cannot work with. Thus, HDBaseT® data cannot be transmitted "as is" over a standard Ethernet/IP network. Therefore, there is a need to provide a way to transmit HDBaseT® data over a legacy Ethernet networks without requiring the networks to utilize non-standard equipment.

One challenge that needs to be addressed when transmitting data according to the HDBaseT® standard over an Ethernet network relates to the issue of synchronization of the different clock frequencies at various points in the network. In an HDBaseT® network, in which each of the points operates according to the HDBaseT® standard, each point in the network can measure the frequency offset from previous points in the network. Thus, the frequency offset between the endpoints (e.g., a sender/source and receiver/sink of a data packet) can be determined by aggregating the frequency offsets of the points along the route between them. This capability is not built into regular Ethernet switches, common in enterprise networks.

Current solutions for clock synchronization typically require special hardware that may not be available in many legacy networks. For example, one approach that may be utilized to propagate a synchronized clock over an Ethernet network is to utilize Synchronous Ethernet, also referred to as SyncE, which is an ITU-T standard for computer networking that facilitates the transference of clock signals end-to-end over the Ethernet physical layer. Typically, each Ethernet port of a switch uses its own clock. The SyncE mechanism enables a port of Ethernet switch to use the clock of another port in the same switch. Thus, a network that supports SyncE can enable all link segments along a path to use the exact same clock frequency, i.e. keep synchronization between the two ends with zero frequency offset. However, typical switches in enterprise environments lack the capability to implement SyncE, thus this solution can require replacing hardware in many cases.

Another approach that may be used to propagate a synchronized clock over an Ethernet network is to transmit using the Precision Time Protocol (PTP), which is a protocol used to synchronize clocks throughout a computer network. On a local area network, this approach can achieve clock accuracy in the sub-microsecond range, making it suitable for measurement and control systems. One widely used standard for PTP is the IEEE 1588v2 standard. To achieve high clock accuracy between end-nodes, the IEEE 1588v2 standard offers the "Transparent Clock" time-stamping mechanism, which mandates each switch measure and report the residence-time of a packet in that switch. However, this standard assumes a symmetric network, which requires an Ethernet network to use the same path for both transmission directions. Additionally, the support for the "Transparent Clock" time-stamping mechanism, which is typically needed to achieve sufficiently high accuracy, is not typically provided in switches used in many existing enterprise networks.

Thus, there is a need for a way to enable an HDBaseT® network that utilizes common enterprise Ethernet switches to implement clock synchronization over the Ethernet network in a way that does not rely on specialized hardware in the switches (e.g., hardware with a transparent clock).

SUMMARY

A goal of some of the embodiments described in this disclosure is to enable offering of some of the many benefits of transmission with an HDBaseT® connection over a standard Ethernet (IP) link. Some examples of these benefits include time-sensitive transmissions, low latency and low latency variation. Providing HDBaseT® performance guarantees when part of the transmission is over an Ethernet network requires various adaptations, some of which are described below. Providing an HDBaseT® connection over a network that does not include hardware that was designed to support HDBaseT® transmission may be referred to herein as providing a "virtual HDBaseT® link".

One aspect of this disclosure involves a system that is configured to provide a virtual HDBaseT® link. In one embodiment, the system includes a first switch and a first processor. The first switch is configured to transmit packets over an Ethernet network that comprises one or more hops that do not implement a transparent clock; the payload of each of the packets comprises an HDBaseT® T-packet belonging to an HDBaseT® session. The first processor is configured to set, for each packet from among a plurality of the packets, a timestamp value in the packet to correspond to the time at which the packet is transmitted by the first switch. The system also includes a second switch that is configured to receive the packets over the Ethernet network, and a second processor that is configured to: calculate a clock correction value based on the timestamps in the plurality of the packets, and utilize the clock correction value to perform at least one of the following: (i) control transmission, by the second switch, of data comprised in T-packets comprised in the payloads of the packets, and (ii) recover a source clock of native media delivered over the Ethernet network.

Another aspect of this disclosure involves a method for providing a virtual HDBaseT® link. In one embodiment, the method includes the following steps: transmitting, by a first switch, packets over an Ethernet network that comprises one or more hops that do not implement a transparent clock (where the payload of each of the packets comprises an HDBaseT® T-packet belonging to an HDBaseT® session), setting for each packet from among a plurality of the packets, a timestamp value in the packet to correspond to the time at which the packet will be transmitted; receiving, by a second switch, the packets over the Ethernet network; calculating a clock correction value based on the timestamps in the plurality of the packets; and utilizing the clock correction value to perform at least one of the following: (i)

control transmission, by the second switch, of data comprised in T-packets comprised in the payloads of the packets, and (ii) recover a source clock of native media delivered over the Ethernet network.

BRIEF DESCRIPTION OF THE DRAWINGS

The embodiments are herein described by way of example only, with reference to the accompanying drawings. No attempt is made to show structural details of the embodiments in more detail than is necessary for a fundamental understanding of the embodiments. In the drawings:

FIG. 7, FIG. 8, FIG. 9, FIG. 10, and FIG. 11 illustrate an example of progression of recovery of two lost packets in a block of n=30 packets;

DETAILED DESCRIPTION

Figure 1:
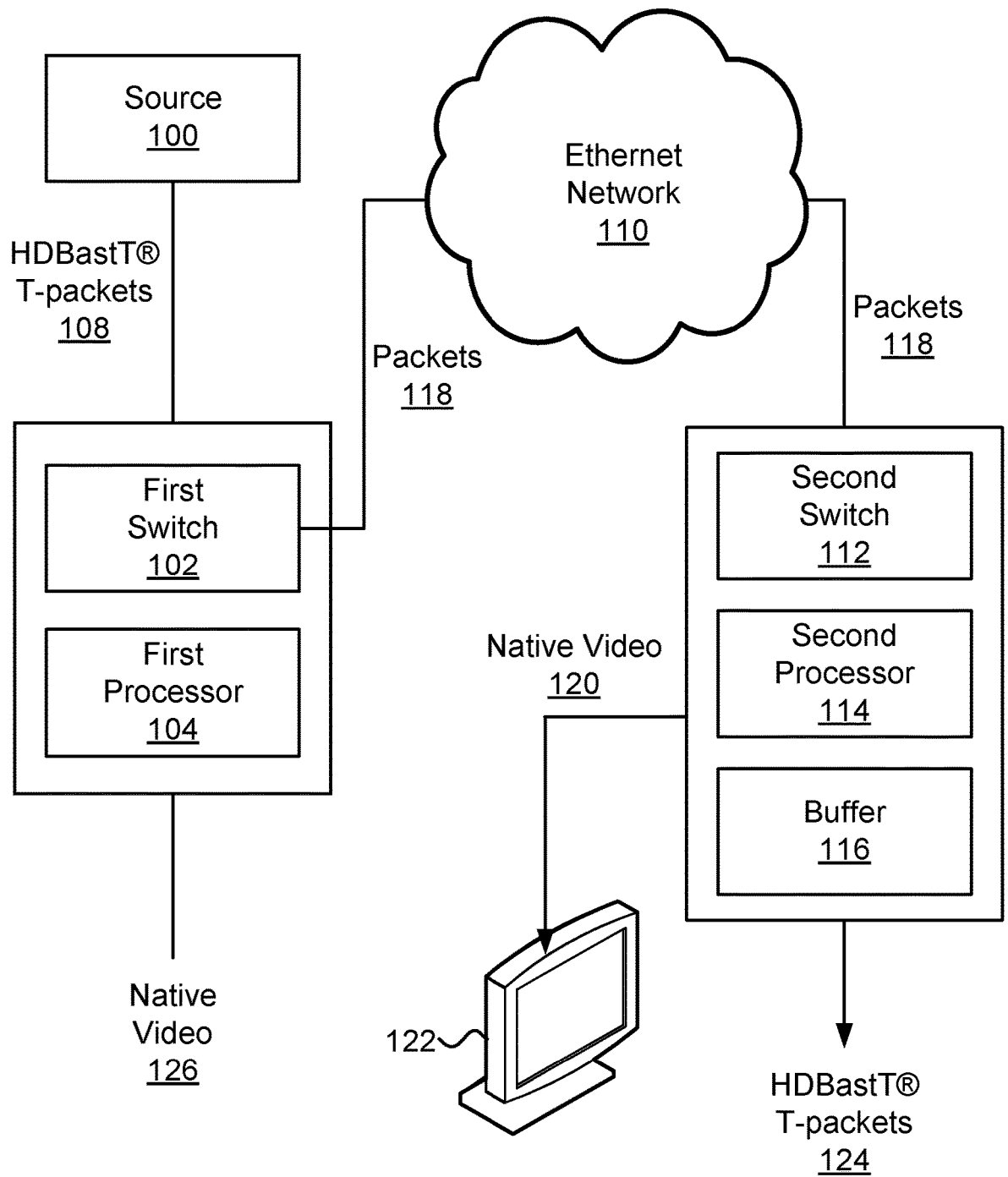
FIG. 1 illustrates an embodiment of a system configured to provide a virtual HDBaseT® link.

Certain terminology is used throughout this document. Some of such terms are defined immediately below; other terms may be defined throughout the Specification.

The core of HDBaseT® networks involves employing a layered architecture, which may be succinctly summarized as follows. The Physical layer creates and maintains the HDBaseT® physical link for the different operation modes and sub-link types. The Link layer defines the general framing format of the HDBaseT® packets used by the different T-Adaptors to create their T-Stream packets (T-packets) and to specify their required T-Network services (T-Services). The Network layer provides networking services to the T-Adaptors and enables them to communicate over the network with matching T-Adaptors using T-Sessions.

A "T-Adaptor" denotes an entity which converts protocol/interface/application data representation to a Multimedia Network representation and/or vice versa. T-Adaptors may use the T-Network services to communicate with other T-Adaptors of the same type. "T-Network" denotes a time sensitive data communication network that includes at least one T-Adaptor. "T-Services" denotes data services that are offered by the T-Network. These services may vary by protocols, interfaces, and/or applications. T-Adaptors communicate with each other after a "session" has been created. In one embodiment, a session defines the communication network path between the T-Adaptors.

In some embodiments, an HDBaseT® network may be a dedicated network that is used to deliver only the traffic of HDBaseT® sessions. Optionally, this dedicated network is managed in a way that each session, prior to establishment, is assigned with enough network resources to guarantee its performance, where no resource oversubscription is allowed. In some embodiments, and HDBaseT® network may be fully controlled for the type of traffic and the amount of traffic that is injected to the network.

Additional details regarding the terms mentioned above, and the HDBaseT® standard in general, may be found in the HDBaseT® Specification version 2.0 of the HDBaseT® alliance from Aug. 4, 2013.

Terms such as "switch" and "router" are used herein to describe communication devices and communication functions that may be used in a communication system, and should not be construed to limit the present invention to any particular communication device type. Thus, a "switch" may refer, without limitation, to one or more of the following: a network switch, a network router, a network bridge, a bridge-router (brouter), or a gateway. Additionally, a switch may optionally include at least two or more ports, a processor and memory.

Herein, an "Ethernet network" may refer to a least one of the following: a standard Ethernet network, and a network that includes a combination of switches, routers and other optional network elements.

One challenge that needs to be addressed when transmitting data according to the HDBaseT® standard over an Ethernet network relates to the issue of synchronization of the different clock frequencies at various points in the network. In an HDBaseT® network, in which each of the points operates according to the HDBaseT® standard, each point in the network can measure the frequency offset from previous points in the network. Thus, the frequency offset between the endpoints (e.g., a sender/source and receiver/sink of a data packet) can be determined by aggregating the frequency offsets of the points along the route between them. This capability is not built into regular Ethernet switches, common in enterprise networks.

The approach described below enables propagation of a synchronized clock over an Ethernet network without requiring special hardware in the Ethernet switches to support solutions such as SyncE or IEEE 1588v2. Thus, HDBaseT®(R) 5-play transmissions (i.e., HD video, audio, Ethernet, controls, USB 2.0 and power) can be sent over low-cost Ethernet infrastructure (e.g., using regular switches typically found in enterprise environments).

FIG. 1 illustrates an embodiment of a system configured to provide a virtual HDBaseT® link. The system includes at least a first switch 102, a first processor 104, a second switch 112, and a second processor 114. The system is used to provide a virtual HDBaseT® link between a first point (the first switch 102 and the first processor 104), connected to an Ethernet network 110, and a second point (the second switch 112 and the second processor 114) that is also connected to the Ethernet network 110. In one example, the Ethernet network 110 includes one or more hops. Optionally, the one or more hops do not include hardware that implements a transparent clock. In another example, the Ethernet network 110 includes two or more hops that do not include hardware that implements a transparent clock.

As mentioned above, in some embodiments, an HDBaseT® domain may be used to send HDBaseT® traffic only, and it is assigned with sufficient network resources to guarantee performance according to the HDBaseT® standard. In one embodiment, the Ethernet network 110, used to provide an HDBaseT® virtual link, is also a dedicated domain that is used to send HDBaseT® traffic only. Thus, in one example the Ethernet network 110 may be a physical network fully dedicated to the delivery of HDBaseT virtual links.

In some embodiments, the Ethernet network 110 may be a virtually dedicated network, that is, the Ethernet network 110 may be obtained by slicing a sub-domain, out of a bigger network. Optionally, this sub-domain is fully dedicated for the virtual HDBaseT® links only. In one example, the slicing may be obtained by assigning certain ports and their associated links, for this sub-domain, using Software-Defined Networking (SDN) techniques. In another example, this sub-domain is a virtual network obtained by partitioning the bigger network into virtual local area network (VLAN), with dedicated bandwidth. Optionally, any other slicing technique may be used to obtain the Ethernet network 110 as a slice of a bigger network.

The first switch 102 is configured to receive data and transmit it over the Ethernet network 110 using packets 118. The transmitted data includes HDBaseT® T-packets 108, encapsulated by the First processor 104 as payload in Ethernet frames, with or without IP stack headers. Additionally or alternatively, the first processor 104 may packetize the native media, such as native video 126, into HDBaseT® packets, as defined by the HDBaseT® specification, and then encapsulate these HDBaseT® packets as payload in Ethernet frames, with or without IP stack headers, and then deliver them towards the Ethernet Network 110 as packets 118 via the first switch 102.

In one embodiment, the T-packets 108 include T-packets of a single HDBaseT® session. In another embodiment, the T-packets 108 include T-packets belonging to multiple HDBaseT® sessions. In one example, the T-packets 108 include T-packets of two or more of the following types: HDMI-AV (TMDS) T-packets, HDMI-Controls T-packets, USB T-packets, UART T-packets, and clock measurement T-packets.

In one embodiment, each of the packets 118 includes in its payload one T-packet. In another embodiment, at least some of the packets 118 include in their payload multiple T-packets, destined to the same second switch 112. For example, a single packet from among the packets 118 may include multiple T-packets with video data.

The first processor 104 may perform various operations involved in the generation and/or transmission of the packets 118. In one embodiment, the first processor 104 sets, for each packet from among a plurality of packets from among the packets 118, a value of a timestamp in the packet to correspond to the time at which the packet is transmitted by the first switch 102. Optionally, setting the value of the timestamp is done while the packet is in a queue of packets that are on their way to be transmitted. In one embodiment, setting the timestamp is done before the packet's cyclic redundancy check (CRC) value is calculated. In another embodiment, the value of the timestamp is set after the CRC is calculated, in which case the first processor 104 calculates a new cyclic redundancy check (CRC) value of the packet due to setting the timestamp. In one example, calculating the CRC involves calculating a new 32-bit value that is entered in the position of the "Frame check sequence" of an 802.3 Ethernet packet. In addition to the operations mentioned above, the first processor 104 may optionally perform operations required to encapsulate the T-packets 108 and/or native video 126 in order to create the packets 118 which enables their transmission over an Ethernet network. For example, the first processor 104 may generate various header/tail data that is required for transmission of packets using one or more of the following protocols: Real-time transport Protocol (RTP), User Datagram Protocol (UDP), Transmission Control Protocol (TCP), Internet Protocol (IP), and Ethernet protocol.

In some embodiment, the first processor 104 and/or a T-adapter may be used to generate clock measurement T-packets that are included in the packets 118 and used for the clock synchronization, as described below.

In different embodiments, the plurality of packets (from among the packets 118) that are the manipulated by the first processor 104 may include different types of packets. In one embodiment, the payload of each of the plurality of packets includes an HDBaseT® clock measurement T-packet and the timestamp is written in a region of the payload that does overlap with the clock measurement T-packet. In another embodiment, the payload of each of the plurality of packets includes a T-packet that is not an HDBaseT® clock measurement T-packet. Optionally, the timestamp is written in a region of the payload that includes the T-packet, such as writing a timestamp field in the T-packet. Additionally or alternatively, setting the timestamp may involve writing a value in a region of the payload of the packet that does not include the T-packet.

In some embodiments, the packets 118 may have different forwarding priorities when transmitted over the Ethernet network 110. For example, in one embodiment, the plurality of packets (from among the packets 118) which are manipulated by the first processor 104, as described above, may have a higher priority than at least some of the other packets from among the packets 118, which may not have had their timestamps set.

Since the plurality of the packets are a subset of the packets 118 that are used for clock synchronization (as described below), assigning the plurality of packets a higher priority for transmission over the Ethernet network 110 may contribute to more accurate clock synchronization. The higher forwarding priority may cause the plurality of packets to incur lower latency variation compared the other packets, and plurality of packets may be less impacted by network load. In one example, transmitting packets with different forwarding priorities over the Ethernet network 110 may be done by including IEEE 802.1Q tags to identify what VLAN a packet belongs to and its priority (quality of service), as defined in the IEEE 802.3ac specification.

In one embodiment, in which the plurality of the packets include clock measurement T-packets, the plurality of packets are transmitted with a higher priority than other packets, from among the packets 118, which do not include clock measurement T-packets in their payload. For example, packets from among the packets 118 that include T-packets with video data are sent over the Ethernet network 110 using a lower priority than the plurality of packets. Optionally, the clock measurement T-packets are delivered continuously with a constant intervals of time between them, which may lend to stability of an algorithm for clock synchronization that relies on their timestamps.

The second switch 112 receives the packets 118, which were sent over the Ethernet network 110. The second processor 114 is configured to: calculate a clock correction value based on the timestamps in the plurality of the packets, and utilize the clock correction value to perform at least one of the following: (i) control transmission, by the second switch 112, of data included in T-packets in the payloads of the packets 118, and (ii) recover a source clock of the native media delivered over the Ethernet network 110. Optionally, the data included in T-packets in the payloads of the packets 118 may include HDBaseT® T-packets 124, which may be the same as the T-packets 108 or T-packets generated to encapsulate native media (e.g., T-packets generated to encapsulate native video 126). Optionally, the clock correction value calculated by the second processor 114 may be utilized to perform clock synchronization across the Ethernet network 110 between the first point (i.e., a clock used by the first switch 102 and/or the first processor 104) and the second point (i.e., a clock used by the second switch 112 and/or the second processor 114).

In one embodiment, the clock correction value is indicative of a clock frequency offset between a local clock of the second switch 112 and a frequency of a reference clock of a source 100 of the HDBaseT® session. Optionally, the source 100 of the HDBaseT® session generated the T-packets 108. Additionally or alternatively, the clock correction value may be indicative of a latency of transmission of packets over the Ethernet network 110, such as the expected latency of the packets 118.

Calculation of the clock correction value relies on observing the difference between when each of the plurality of packets were sent by the first switch 102 (as indicated by the timestamps written by the first processor 104) and when those packets were received by the second switch 112 (as determined by a clock of the second switch 112). Thus, calculation of the clock correction value may be viewed as a calculation that is based on multiple pairs of timestamps (TS,TR), where TS corresponds to the time at which a packet from among the plurality of packets was transmitted by the first switch 102 and TR corresponds to a time at which the packet was received by the second switch 112. Optionally, TS is set in accordance with a reference time of the first switch 102, while the TR set in accordance with a reference time of the second switch 112. The clock used by the first switch 102 to advance the time counter may operate at a different frequency than the clock used by the second switch 112 to advance the time counter. In addition, the two time counters of the first switch 102 and the second switch 112 may have a relative offset, as each node may have started its counting in a different point in time.

In one embodiment, the clock correction value is indicative of the average of the differences TR−TS of the multiple pairs of timestamps. In another embodiment, the clock correction value is value that corresponds to a time t, and is calculated using a function f(t), whose parameters are determined based the values of timestamps (TS, TR) of the multiple pairs. For example, the parameters of f(t) may be set using regression, as discussed in more detail below.

Figure 2:
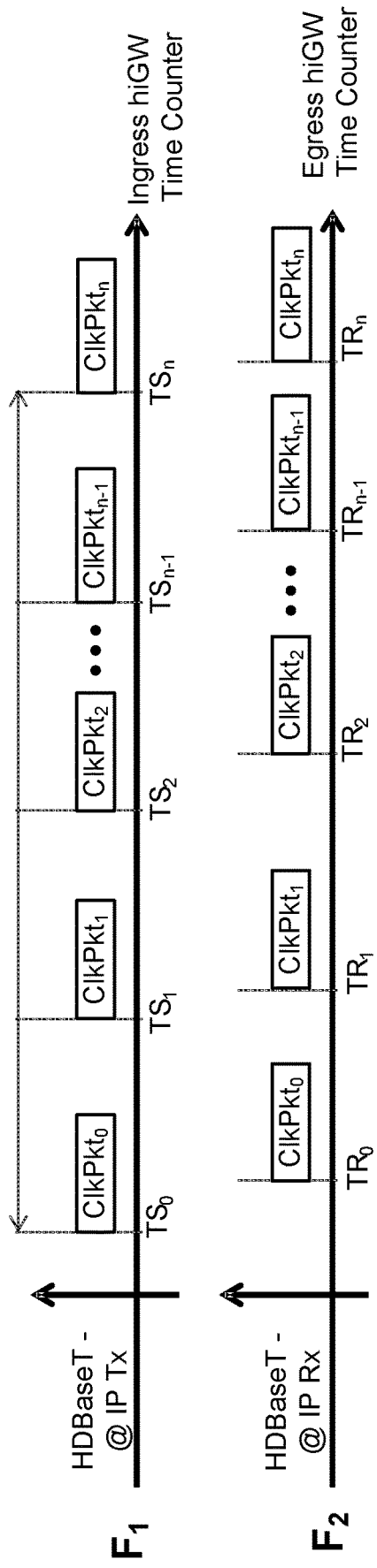
FIG. 2 illustrates an example of pairs of timestamps from transmission of a plurality packets.

It is to be noted that the two aforementioned clocks may be independent of each other. Thus, in addition to not being synchronized, they may exhibit different drifts as time progresses. By utilizing multiple pairs of timestamps, various parameters required in order to synchronize between the clocks can be estimated. An example of pairs of timestamps from transmission of the plurality packets is given in the FIG. 2, which illustrates when n+1 packets are sent from network point F1 to network point F2. The differences between the n+1 pairs of times (TR0−TS0, . . . , TRn−TSn) may be used in various ways in order to calculate parameters used in synchronizing clocks in a network, as discussed below.

In some embodiments, calculating the clock correction value is performed over time (i.e., multiple clock corrections values are calculated at different times), in order to estimate parameters such as the clock drift between the clocks at the first and second points. Optionally, each clock correction value is calculated using a sliding window and/or multiple windows spanning multiple periods of time. Optionally, each window includes multiple pairs of timestamps (TS, TR).

The following is a discussion regarding the need for the calculation of the clock correction value(s). Clock synchronization in a network, such as the Ethernet network 110, typically involves calculating and/or accounting for the accumulated latency observed in the timestamps of packets sent over the network. The observed accumulated latency, denoted herein LVD, is a value that typically comprises three components: latency variation (LV), TxDuration, and clock drift. LVD represents a difference in the times observed between when a packet is sent from a first network point and when it is received at a second network point.

Latency variation (LV) is the sum of all periods of time that a packet was held at a switch (for various reasons) along the route between the first point and the second point. Some reasons that a packet may be held at a switch include being in a queue and/or being delayed due to a synchronization difference of clocks. LV is a value that may vary at different times, for example, based on the congestion level of the network.

TxDuration is the time that is required to transmit a packet. This value increases (typically linearly) with the size of the packet (i.e., the number of bits in the packet). If LVD analysis is performed using packets of the same size (e.g., when using clock measurement T-packets and/or video packets of the same length), then this term can be ignored, since it is expected to be the same for packets of the same size (and it can be added as a constant value to the latency variation). Another possibility is to subtract the time required to transmit each packet; however, this number should be multiplied by the number of hops that exist along the route (since each hop performs a transmission of the packet).

Clock Drift is a constant that represents how the time kept by a clock deviates from the actual time that passes. In a network, the clock drift between two clocks (e.g., at a source and destination) represents the extent to which the difference between the time kept by the clocks grows as the times passes. For example, if the first clock has a drift of +10 PPM and the second clock has a drift of −20 PPM comparing to some master clock, the relative clock drift that is observed will be +30 PPM. A common assumption that is often made is that any clock in an HDBaseT® network will have a drift in the range of ±100 PPM. Thus, the maximal absolute clock drift between any two nodes in the network is 200 PPM.

In some embodiments, since all clock measurement T-packets carrying the timestamps are of the same length, the TxDuration for each clock measurement T-packet is a constant value. Thus, the two non-constant sources of the time differences are LV and clock drift (frequency offset) and thus these differences are referred to herein as LVD. Optionally, averaging multiple values of LVDs, consolidate the LV (and the TxDuration) to a value that may be treated as a constant. Thus, comparing two average values of LVDs in different time points, will show a difference that is a result of only the drift between the clocks, corresponding to the time elapsed between these two points in time.

It is to be noted that when packets of Ethernet network traffic, which are used to calculate clock correction values, include video data, the blanks that are part of such video streams may pose a problem since they may cause missing time measurements. Examples of blanks may include blanks that occur at the beginning of a line of pixels or blanks at the end of a frame. If this phenomenon is not addressed, it may skew clock correction values. In one embodiment, this phenomenon may be addressed by computing values (e.g., an observed LVD) based on packets that include pixels at the end of video rows (and possibly not including in the calculations blanks). In another example, missing values (e.g., of observed LVD) may be substituted with expected values (e.g., expected LVD) when no timing data is obtained due to blanks (e.g., blanks between frames).

Figure 3:
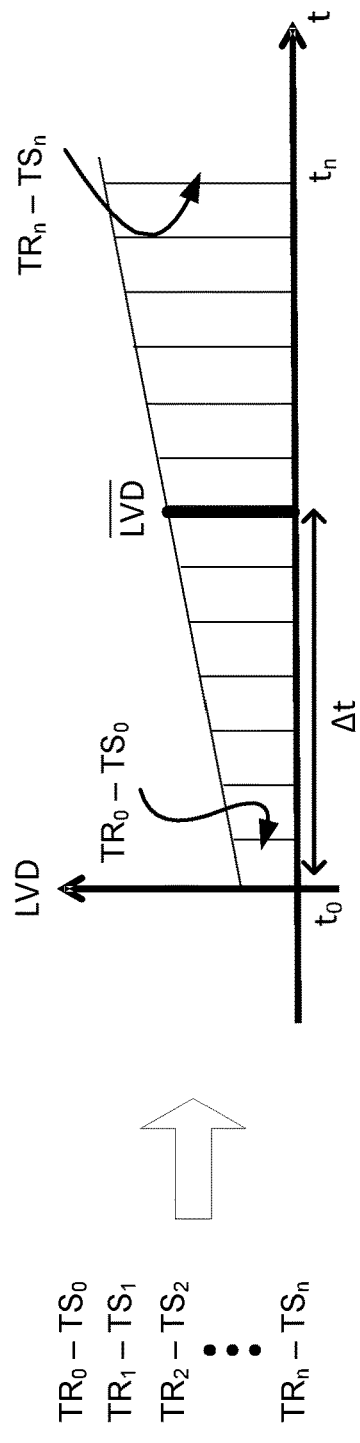
FIG. 3 illustrates one approach for estimating observed accumulated latency (LVD) using timestamps measured for packets transmitted on a network.

FIG. 3 illustrates one approach for estimating observed accumulated latency (LVD) using timestamps measured for packets transmitted on a network such as the Ethernet network 110. The clock drift, as discussed above, is a value that increases with time. Clock drift may change due to environmental conditions, such as the temperature, however, these changes are usually slow in time, and in this example, there are typically no abrupt changes in the rate of clock drift since the window of time showed (hundreds of milliseconds) enable us to assume that the environmental conditions are constant Thus, when taking into account clock drift, which increases over time, along with latency variation (LV) and TxDuration, the LVD will typically behave as an arithmetic series. This enables the calculation of an expected LVD (LVD). For example, the pairs of timestamps depicted in FIG. 3 may be plotted according to the timestamp of each received packet. Thus, at each point in time Δt–(tn–t0)/2, the value LVD is an average of latencies of packets sent between the times t0 and tn.

In one embodiment, in order to calculate value of clock drift, multiple values of LVD are calculated for different times with respect to a certain reference time (t0). The rate of change in the values LVD (e.g., the slope of a graph of the values LVD over time), corresponds to the clock drift.

Additional approaches for estimating clock correction values from pairs of timestamps (observed when packets are sent/received) may involve performing some form of regression and/or training of a machine learning-based model. In one example, the value of LVD may be given based on the following formula LVD(s,t)=a·s+b·t+c, where a, b, and c are constants that need to be learned from the data, s is the size of the packet, and t is the time of transmission (e.g., relative to an initial time where t=0). In one example, a is a value related to TxDuration, b is related to the clock drift, and c is related to LV (since in this model does not depend on the time of transmission nor on the size of the packet). In this example, the n+1 pairs of timestamps illustrated in FIG. 3 may be utilized in a regression to find the values of a, b, and c that minimize the difference (e.g., in terms of squared error) between the observed latencies and predicted latencies based on the equation LVD(s,t)=a·s+b·t+c. In another example, LVD at a given time may be described via parameters of a distribution, such as a Gaussian (or some other probability density function) whose center of weight is the average LVD of the packets used to compute it.

Clock correction values calculated by the second processor 114 are utilized to transmit the T-packets 124, and/or other data (e.g., native video 120), in a manner that corresponds to the HDBaseT® standard. Optionally, transmission in the manner that corresponds to the HDBaseT® standard, involves maintaining one or more of the following: (i) latency between when a T-packet is received by the first switch 102 and when it is transmitted by the second switch 112 is below a threshold, and the threshold is below 100 μs; and (ii) the clock correction value is indicative of a frequency offset within ±100 PPM (i.e., 200 PPM) between a local clock of the second switch 112 and a reference clock of the source 100 of the HDBaseT® session that generated the T-packet.

In one embodiment, the T-packets 124 may include packets that have a certain type of data that may require that packets be transmitted in a certain order. For example, the T-packets 124 may include certain T-packets that include T-packets of one or more of the following types: HDMI audio/video T-packets, and USB T-packets. Optionally, in this case, transmitting the data comprised in the T-packets in the manner that complies with the HDBaseT® standard involves transmitting the certain T-packets, by the second switch 112, in the same order in which the certain T-packets were received by the first switch 102.

In one embodiment, the second switch 112 transmits the T-packets 124 on an HDBaseT® link. In this embodiment, the second processor 114 may update the "FreqOffset" field of transmitted clock measurement T-packets based on clock correction values it calculates.

It is to be noted that when packets transmitted by the first switch 102 include HDBaseT® T-packets belonging to multiple HDBaseT® sessions, the second processor 114 may calculate multiple clock correction values corresponding to the multiple HDBaseT® sessions. In this case, each clock correction value may correspond to a certain HDBaseT® session and is indicative of a clock frequency offset between the local clock of the second switch 112 and a frequency of a reference clock of the source of the certain HDBaseT® session. Optionally, when transmitted on an HDBaseT® link, the "FreqOffset" field of transmitted clock measurement T-packets is updated according to the clock correction values calculated for their respective sessions.

In some embodiments, an HDBaseT® session may involve transmission of T-packets coming from different T-streams (e.g., in order to transmit different types of data and/or data from different sources in the same session). In these embodiments, clock measurement T-packets from each T-stream may be utilized to calculate clock correction values used to synchronize the transmission of the T-packets belonging to the T-stream.

Transmitting the T-packets 124, and/or the data the T-packets 108 comprise, in a manner that corresponds to the HDBaseT® standard may involve retaining at least some data in a buffer 116. Optionally, storing data in the buffer 116 enables the system to address network phenomena such as jitter and/or lost packets, which may cause interruption in the transmission of the T-packets 124, and/or the data they comprise, in a manner that does not correspond to the HDBaseT® standard.

In one embodiment, storing the T-packets 124 in the buffer 116 enables the second processor 114 to implement a functionality of a pacer for the T-packets 124. Optionally, the pacer recovers the source shaping (order and frequency) of transmission of the T-packets 124, which allows handling of real time traffic that may suffer from bursts and/or high jitter from transmission over the Ethernet network 110. Optionally, the second processor 114 utilizes clock correction values to determine when to transmit the T-packets, over an HDBaseT® link, in a manner that maintains a certain required shaping, i.e. maintain order of transmission of the T-packets and/or a certain required pace between successive transmitted T-packets.

In another embodiment, at least some of the data in the payloads of the packets 118 includes uncompressed video. Optionally, the second processor 114 utilizes clock correction values to recreate a native clock that controls release of pixel data (the native video 120) of the uncompressed video to a video adapter (e.g., an adapter of display 122). In one example, native video 120 is the same as native video 126. In another example, native video 126 is generated from video data comprised in the T-packets 108.

Calculating clock correction values may be done at different times. In one embodiment, these calculations are done when a new session is initiated. Optionally, these various calculations are performed as part of the synchronization process involved in creating a virtual HDBaseT® link that uses, as part of the link, transmission over the Ethernet network 110.

Clock synchronization in a virtual HDBaseT® link that involves transmissions over the Ethernet network 110 may not be an immediate process (since it requires timestamps of packets sent/received over the network). In order to reduce the consolidation time required for synchronizing the clocks and obtaining a value of PPM latency between two network points, in one embodiment, the synchronization process operates in two stages. In the first stage, upon link establishment, prior to when video/audio traffic is transmitted, timestamps in packets are delivered between the end points until calculations of parameters required to synchronize clocks on the network show stability. In a second, later stage, when a session is established and actual video/audio traffic is delivered, the process of transmission of timestamps in packets starts again, with the same values of "clock correction" parameters recently calculated as a starting point (e.g., values calculated on link establishment in the first stage). Thus, relatively accurate parameter values needed for clock synchronization may be immediately available when the actual video/audio traffic needs to be delivered. This two-stage mechanism enables the second switch 112 to quickly acquire the clock drift value at link establishment, and then to continuously follow any slow changes in the drift due to environmental changes (e.g. temperature).

Figure 4:
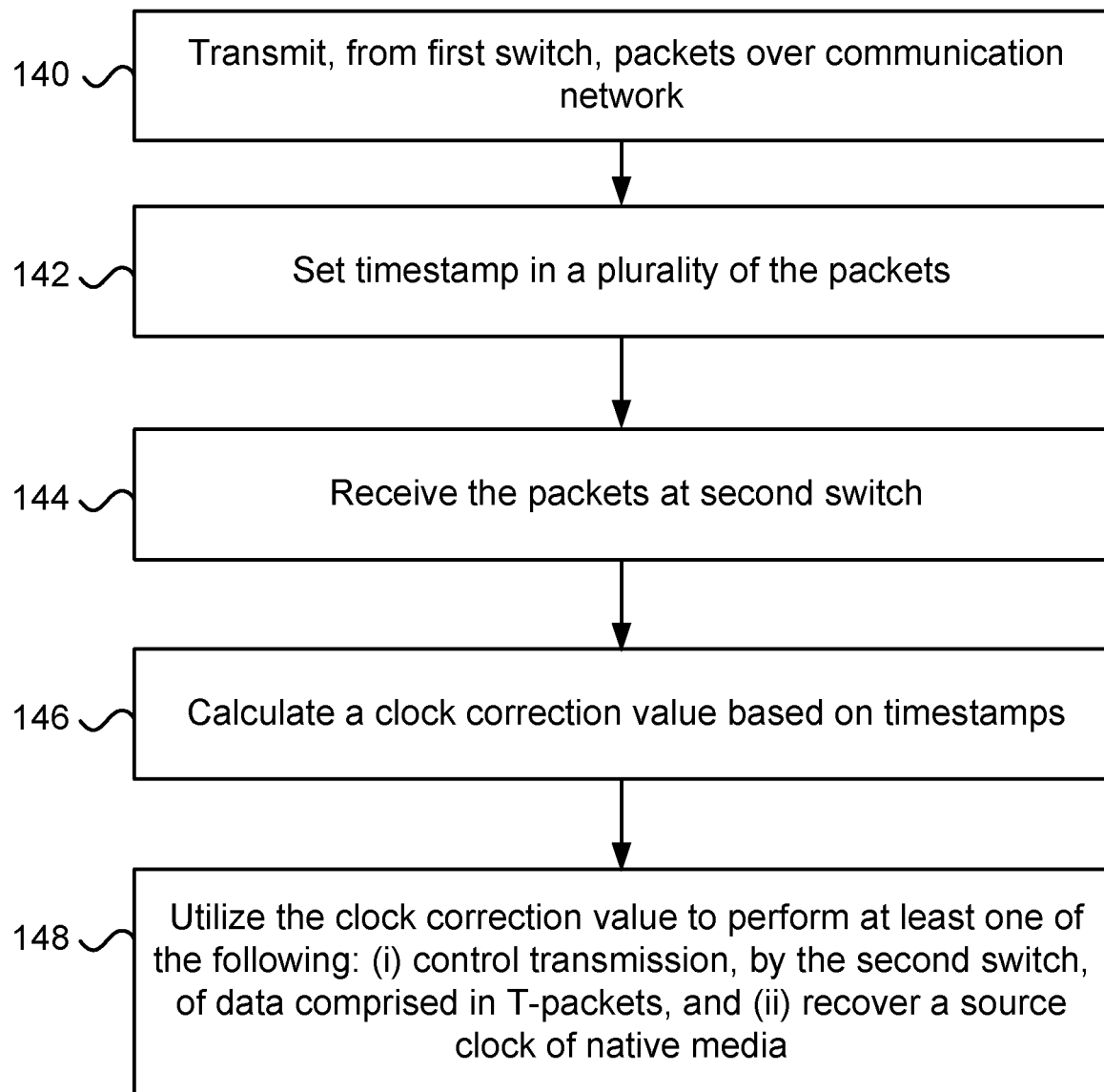
FIG. 4 illustrates one embodiment of a method for providing a virtual HDBaseT® link.

FIG. 4 illustrates one embodiment of a method for providing a virtual HDBaseT® link. In one embodiment, the method includes at least the following steps:

In Step 140, transmitting, by a first switch (e.g., the first switch 102), packets over an Ethernet network that comprises one or more hops that do not implement a transparent clock. Optionally, the payload of each of the packets comprises an HDBaseT® T-packet belonging to an HDBaseT® session.

In Step 142, setting for each packet from among a plurality of the packets, a timestamp value in the packet to correspond to the time at which the packet will be transmitted. Optionally, the payload of each of the plurality of the packets comprises an HDBaseT® clock measurement T-packet and further comprising writing the timestamp in a region of the payload that does not overlap with the clock measurement T-packet.

In Step 144, receiving, by a second switch (e.g., the second switch 112), the packets over the Ethernet network.

In Step 146, calculating a clock correction value based on the timestamps in the plurality of the packets.

And in Step 148, utilizing the clock correction value to perform at least one of the following: (i) control transmission, by the second switch, of data comprised in T-packets comprised in the payloads of the packets, and (ii) recover a source clock of native media delivered over the Ethernet network.

In one embodiment, the method optionally includes a step of calculating a clock frequency offset between a local clock of the second switch and a frequency of a reference clock of the source of the HDBaseT® session. Optionally, the method also includes a step of transmitting, by the second switch, the T-packets on an HDBaseT® link and updating the "FreqOffset" field of transmitted clock measurement T-packets based on the clock frequency offset. Optionally, the packets transmitted by the first switch comprise HDBaseT® T-packets belonging to multiple HDBaseT® sessions, and the method further includes a step involving calculating multiple clock correction values corresponding to the multiple HDBaseT® sessions, with each clock correction value corresponding to a certain HDBaseT® session being indicative of a clock frequency offset between the local clock of the second switch and a frequency of a reference clock of the source of the certain HDBaseT® session.

In one embodiment, the method optionally includes a step of calculating latency of transmission of packets over the Ethernet network.

In one embodiment, the Ethernet network is a virtual network and the method include a step of slicing certain ports using Software-Defined Networking (SDN) to obtain the Ethernet network. Additionally or alternatively, the method may include a step of dedicating bandwidth in a virtual local area network (VLAN) to obtain the Ethernet network. Additionally or alternatively, the method may include a step of slicing a sub-domain out of a bigger network to obtain the Ethernet network.

In one embodiment, the method optionally includes a step of transmitting a packet whose payload comprises a T-packet with video data with a lower forwarding priority than a packet whose payload comprises a clock measurement T-packet.

In one embodiment, the method optionally includes a step of calculating the clock correction value based on multiple pairs of timestamps (TS, TR), where TS corresponds to the time at which a packet was transmitted by the first switch and TR corresponds to a time at which the packet was received by the second switch.

In one embodiment, the method optionally includes a step of controlling transmission of data comprised in the T-packets such that the data is transmitted in a manner that complies with the HDBaseT® standard, which involves maintaining one or more of the following: (i) latency between when a T-packet is received by the first switch and when it is transmitted by the second switch is below a threshold, and the threshold is below 100 µs; and (ii) the clock correction value is indicative of a frequency offset within ±100 PPM between a local clock of the second switch and a reference clock of the source of the HDBaseT® session.

In one embodiment, the method optionally includes a step of determining based on the clock correction value when to transmit the T-packets, over an HDBaseT® link, in order to maintain a certain order of transmission of the T-packets and a certain delay between when successive T-packets are transmitted. Additionally or alternatively, the method may optionally include a step of storing data in the payloads of the packets received by the second switch, which comprises uncompressed video, in a buffer and utilizing the clock correction value to recreate a native clock that controls release of pixel data of the uncompressed video to a video adapter.

Another challenge that needs to be addressed when transmitting data of an HDBaseT® session over an Ethernet network relates to the issue of packet recovery. Typical behavior with packets in an Ethernet network is to discard packets that have an error (e.g., a CRC error). This can cause packets to be lost, which may have undesired consequences like a missing patch in a video frame that can cause a monitor to re-sync. The typical solution to lost packets in Ethernet networks involves requests for retransmissions. However, this may involve a long turnaround times and large buffers, on both sides, at the transmitter and receiver. The size of the buffers, can be large because it is a linear function of the turnaround time of the link (retransmission request and response time). The turnaround time may depend on various factors such as the network topology (i.e. number of hops) and network load. Thus, retransmission over multi-hop network, may be less suitable for real-time applications (like streaming high definition video).

One aspect of this disclosure involves FEC for packet recovery that does not mandate a packet buffer at the sender side, only at the receiver side, in which the buffer size is constant and depends on the FEC block size (not the retransmission time). This makes this packet recovery approach much more appropriate for end-to-end real-time applications. The approach described herein works with more than one network hop, and requires no special functionality from the switches participate in the transmission. Additionally, the approach for FEC packet recovery described herein sends the redundancy information (parity data) separate from the data packets it protects.

Figure 5:
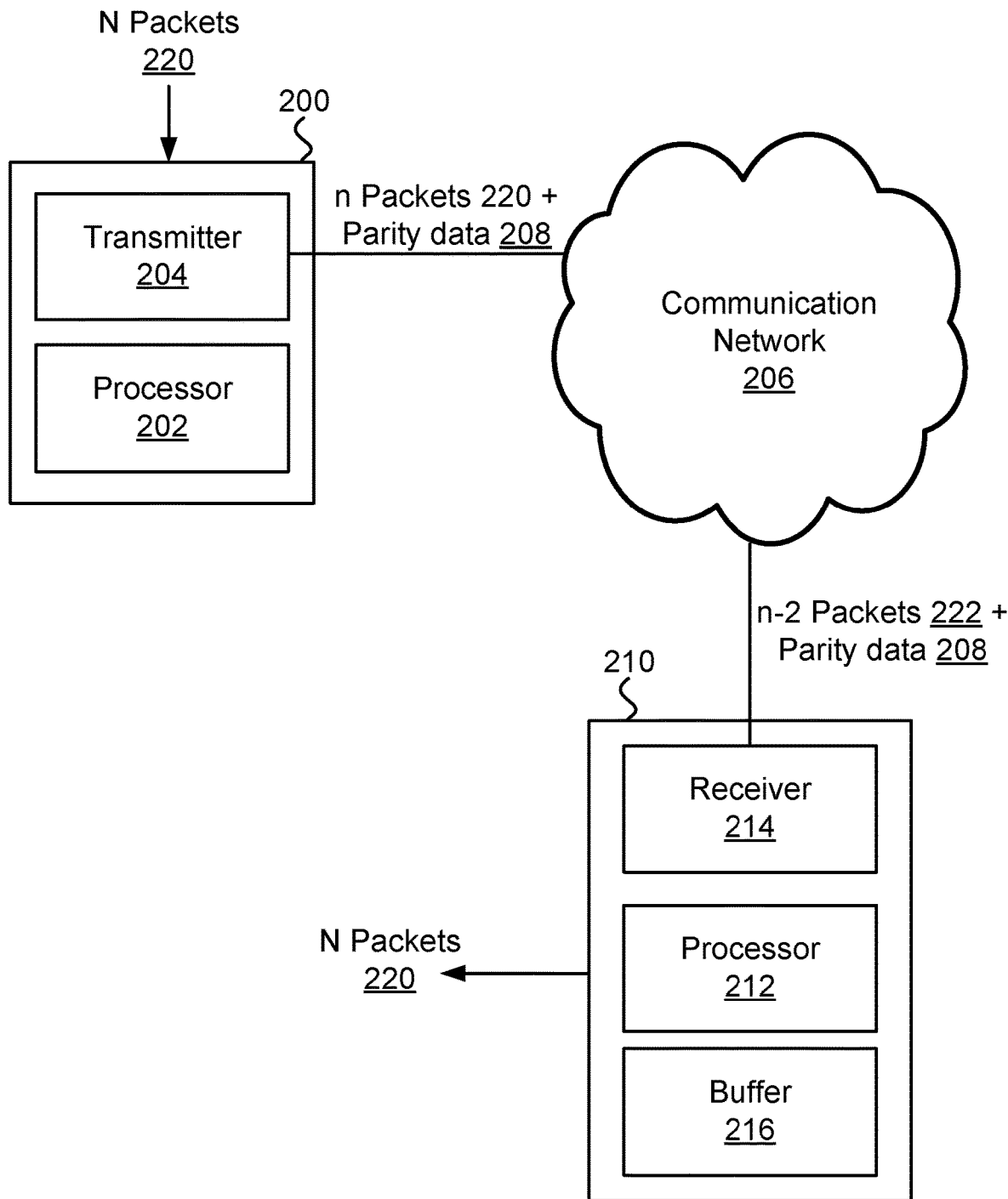
FIG. 5 illustrates a system for transmitting packets over a communication network with forward error correction (FEC) that enables recovery of two lost packets.

FIG. 5 illustrates a system for transmitting packets over a communication network 206 with forward error correction (FEC) that enables recovery of two lost packets, and in some cases more than two lost packets. The recovery of the lost packets is done without the need to request a retransmission of the lost packets. Thus, by reducing, and possibly essentially eliminating, the need for retransmissions, the system can reduce the latency variation exhibited by the communication network 206.

The system illustrated in FIG. 5 operates on blocks of n packets (n packets 220), where n is typically selected such that n+1 is a prime number greater than 3. Some examples of values for n that may be used in embodiments described herein include 10, 30, and 60. The system comprises two devices, a first device 200, which transmits, over the communication network 206, data that includes the n packets 220 along with parity data 208 for those packets. The second device 210, receives data over the communication network 206. When the second device receives n−2 packets 222 (i.e., all but 2 packets from among the n packets 220) and the parity data 208, it can utilize the parity data 208 to recover the two lost packets. Thus, the second device 210 can send the n packets 220 downstream without needing to wait for the lost packets to be retransmitted over the communication network 206.

The first device 200, which is configured to enable recovery of lost packets transmitted over the communication network 206, includes processor 202 and transmitter 204.

The processor 202 calculates the parity data 208, which includes a row parity packet (RPP) and a diagonal parity packet (DPP) for the n packets 220. The data in each packet from among RPP, DPP, and the n packets 220 can be partitioned into n segments. Optionally, each of the segments has an equal size. It is to be noted that if the size of the data in a packet does not divide equally into n parts, it may still be segmented into n segments of equal size by adding zero padding (which does not change the parity of the data). Optionally, the n segments of the packets (the n segments in each of RPP, DPP, and the n packets 220) all have the same size. Again, if different packets have data of different sizes, smaller packets may be zero-padded in order for all segments to have an equal size without affecting the value of parity data. When calculating the parity data 208, the process utilizes each packet, from among the n packets 220, to update parity values in RPP and DPP in such a way that each segment in the packet is used to update one segment in RPP and at most one segment in DPP. A more detailed discussion of the calculation of the parity data 208 is provided further below.

The transmitter 204 transmits data that includes the n packets 220 and the parity data 208 (which includes RPP and DPP) over the communication network 206. Since as explained below, the parity data 208 may be calculated in an iterative fashion, in some embodiments, once a packet from among the n packets 220 is used to calculate the parity data it is not be needed anymore and it can be transmitted over the communication network 206. This means that some embodiments of the first device 200 may not require a buffer large enough to store the n packets 220. Additionally, this can reduce latency involved in data transmissions, since the first device 200 may commence transmission of the n packets 220 even before finishing the calculation of the parity data 208 (since packets that were already used in calculations are not needed any more). In particular, in one embodiment, the transmitter 204 transmits one or more of the n packets 220 before the processor 202 updates the values of RPP and DPP based on one or more other packets from among the n packets 220.

Figure 7:

The following is a discussion of how the parity data 208 (i.e., RPP and DPP) may be calculated in some embodiments. Conceptually, the n packets 220 can be viewed as an n×n table of segments. FIG. 7, illustrates how the data in 30 packets denoted D0, . . . , D29 can be organized in a 30×30 table of segments.

Each segment in RPP is calculated based on the values of n segments belonging to a row parity set that includes a segment of the data from each of the n packets 220. The row parity sets are mutually exclusive, such that intersection between each row parity set does not include any segments from any of the n packets 220. One way at which row parity sets may be assigned segments is to simply assign the segments in each row in the table to a row parity set that is used to calculate the parity values of the corresponding segment of RPP that is located on that row.

Calculating parity values based on segments in a parity set (e.g., a row parity set) refers to the computation of a parity function such as the exclusive OR (XOR) between the segments in the parity set. Optionally, this calculation involves calculating a bitwise XOR between the segments in the parity set. The first bit in the result from the parity function (e.g., in a segment in RPP) is the bitwise XOR of the first bit in each of the segments in the parity set, the second bit in the result of the parity function is the bitwise XOR of the second bit in each of the segments in the parity set, etc. Thus, at the end of the parity calculations, each bit in the segments of RPP (or DPP) is a result of a bitwise XOR between n bits, each coming from a different segment belonging to a parity set of n segments. In some embodiments, the values of bits in the segments in RPP (or DPP) may include the complement of the bitwise XOR, instead of the result of the bitwise XOR.

It is to be noted that calculating a bitwise XOR between multiple segments (e.g., segments in a parity set) can be done incrementally. For example, segments in RPP or DPP can be updated n times, each time based on segments belonging to a different packet.

Similarly to the segments of RPP, each segment in DPP is calculated based n segments that belong to a diagonal parity set. Each diagonal parity set includes n segments each coming from a different packet selected from the set of n+1 packets that includes the n packets 220 and RPP. One way at which diagonal parity sets may be assigned, is by assigning segments that appear on the same diagonal in the n×n table of segments to the same diagonal parity set. Such an assignment of segments to diagonal parity sets is illustrated in FIG. 7, were the number in each cell (segment) in the table designates the number of the diagonal parity set to which that segment belongs. Optionally, since each diagonal parity set consists of n segments (from n different packets) that are selected among n+1 segments (from n+1 packets), for any given packet from among the n packets 220 and RPP, there is always a diagonal parity set that does not include any segments of that packet. As described further below, this property may be utilized for recovering lost packets since it facilitates "recovery anchors".

In some embodiments, the assignment of segments to row parity sets and diagonal parity sets may be known a priori to both the processor 202 and the processor 212. For example, the assignment of segments to parity sets may be done according to a predetermined logic. In one example, the assignment of segments to parity may be done as illustrated in FIG. 7 for each block of 30 packets. In other embodiments, the processor 202 may determine assignment of segments to parity sets and provide information regarding the assignment to the processor 212 by adding to the payload of one or more packets (e.g., to RPP or DPP) information about the assignments.

Since segments in RPP are in various diagonal parity sets, in some embodiments, the processor 202 updates the segments of DPP based on the segments of RPP prior to the transmission of DPP.

In some embodiments, the processor 202 calculates, in addition to RPP and DPP, an anti-diagonal parity packet (ADPP) for the n packets 220. Similarly to DPP, ADDP comprises n segments, and the processor 202 utilizes each packet, from among the n packets 220, to update parity values in ADPP based on the packet, such that each segment in the packet is used to update at most one segment in ADPP. Like DPP, one segment in each packet may be "missed" by ADDP and not belong to any one of the anti-diagonal parity sets that are used calculate the segments of ADPP. The anti-diagonal parity sets used to calculate the segments of ADPP are orthogonal to the diagonal parity sets used to calculate DPP, such that for each packet, from among the n packets 220, at most one segment of the packet is used to update parity values in a segment of DPP and ADPP. The transmitter 204 transmits ADPP over the communication network 206. Receiving any subset of n members, from among a set comprising: RPP, DPP, ADPP, and the n packets 220, can enable the processor 212 to recover three lost packets from among the n packets 220.

The second device 210 receives data sent by the first device 200 over the communication network 206. The second device 210 includes a receiver 214 and the processor 212, and may optionally include other components such as a buffer 216. In some cases, in which some of the n packets 220 are lost, the second device 210 may recover the lost packets using the parity data 208.

The receiver 214 is to receive packets sent over the communication network 206. In one embodiment, the receiver 214 receives n packets (received packets) that belong to a set comprising n+2 packets transmitted over the communication network 206 (where the set of n+2 includes the n packets 220, RPP, and DPP). Optionally, the set of the n+2 consists: the n packets 220 (also referred to as "n data packets"), RPP, and DPP. The received packets include n−2 packets 222 (from among the n packets 220). As discussed above, each of the received packets comprises n segments. Each segment of RPP comprises a result of a parity function applied to a row parity set comprising n segments, each belonging to a different packet from among the n packets 220. Additionally, each segment of DPP comprises a result of a parity function applied to a diagonal parity set comprising n segments, each belonging to a different packet selected from a group comprising the n packets 220 and RPP.

The processor 212 is configured to utilize the received packets (i.e., the n−2 packets 222 and the parity data 208) to recover, from among the set of n+2 packets transmitted over the communication network, packets that were not received by the receiver, which in one embodiment include two lost packets from among the n packets 220. Optionally, the system includes the buffer 216 which stores the received packets, the processor 212 evaluates the received packets to determine which packets were lost. Identification of lost packets can rely on batch ids and/or packet ids that are provided as part of the header data and/or payload data of the n packets 220, RPP, and/or DPP.

The following discussion relates to recovery of two lost packets from among the n packets 220. In other scenarios, the recovery of two lost packets may be more straightforward. In the case that the two lost packets are RPP and DPP, this fact can be identified and no recovery of lost packets may be necessary. In the case where there is a lost packet from among the n packets 220 and another lost packet from among RPP or DPP, the recovery of the lost packet from among the n packets 220 can be done in a straightforward fashion since each parity set, in the other parity packet that was not lost, is missing only one segment.

Recovery of the lost packets by the processor 212 is done, in some embodiments, using an iterative process, in which the segments of the lost packets are recovered, typically one at a time. In the case of recovery of two lost packets, the iterative process involves performing the following until all segments of the two packets are recovered: (i) selecting a parity set, which has only a single segment that has yet to be recovered, from among the row parity sets used to calculate the segments of RPP or from among the diagonal parity sets used to calculate the segments of DPP, (ii) recovering the values of the single segment based on values of the rest of the segments belonging to the selected parity set. Following is a more detailed explanation of how the recovery is performed.

In the general case, the fact that there are two lost packets means that all row parity sets, and most of diagonal parity sets, have two missing segments. If a parity set is missing two segments, those two segments cannot be reconstructed since their values cannot be determined conclusively. However, the diagonal parity sets each include n segments selected from n+1 packets (the n packets 220 and RPP). Thus, for every diagonal parity set, there is a certain packet that is not included in the diagonal parity set, and thus the ability to recover the values of segments in that diagonal parity set is not effected by the loss of the certain packet. Conversely, for each packet, from among the n packets 220, DPP includes a segment calculated based on a diagonal parity set that does not include any of the segments of that packet. Thus, when there are two lost packets, there are two segments in DPP that are only missing one (lost) segment in their diagonal parity set. These segments can be viewed as "recovery anchors", since they can be recovered based on the other packets that were received. Their recovery can in turn lead to recovery of other segments in the lost packets, until all the segments in the two lost packets are recovered.

The process of recovery of two lost packets is illustrated in FIG. 7 to FIG. 11. FIG. 7 illustrates a table that includes a block of n=30 packets (denoted D0, . . . D29), each including n=30 segments. Additionally, the table includes RPP and DPP. The number in each cell (segment) in the table denotes the diagonal parity set to which the segment belongs. FIG. 7 illustrates two lost packets, D9 and D17. Since there are no segments from D9 in diagonal parity set number 8, this diagonal parity set can serve as a recovery anchor. Similarly, since there are no segments from D17 in diagonal parity set number 16, this diagonal parity set can also serve as a recovery anchor. FIG. 8 to FIG. 11 illustrate one way in which such a recovery process may proceed.

The recovery starts with the recovery anchor 16. Since there are no segments from D17 in diagonal parity set 16, there is only one segment missing from that diagonal parity set, and that is the segment in position [7,9] (i.e., row 7, column D9). The values of the bits in this segment can be determined using a bitwise XOR with the rest of the segments in this diagonal parity set since none of those segments is missing. The recovered segment [7,9] is marked in the table with a circle (in the figures, recovered segments in D9 and D17 are marked with circles). The recovery of segment [7,9] enables the recovery of an additional segment, [7,17]. The recovery of [7,17] is possible because once segment [7,9] was recovered, the row parity set for row number 7 has only one missing segment (which is [7,17]) and thus it could be recovered based on a bitwise XOR with the rest of the segments in that row. Once segment [7,17], which belongs to diagonal parity set 24, is recovered, it enables the recovery of another segment, [15,9] which also belongs to diagonal parity set 24, which following the recovery of segment [7,17] now only has one missing segment. Thus, the iterations can continue in the order indicated by the arrows between cells of the table.

Figure 8:
Figure 9:
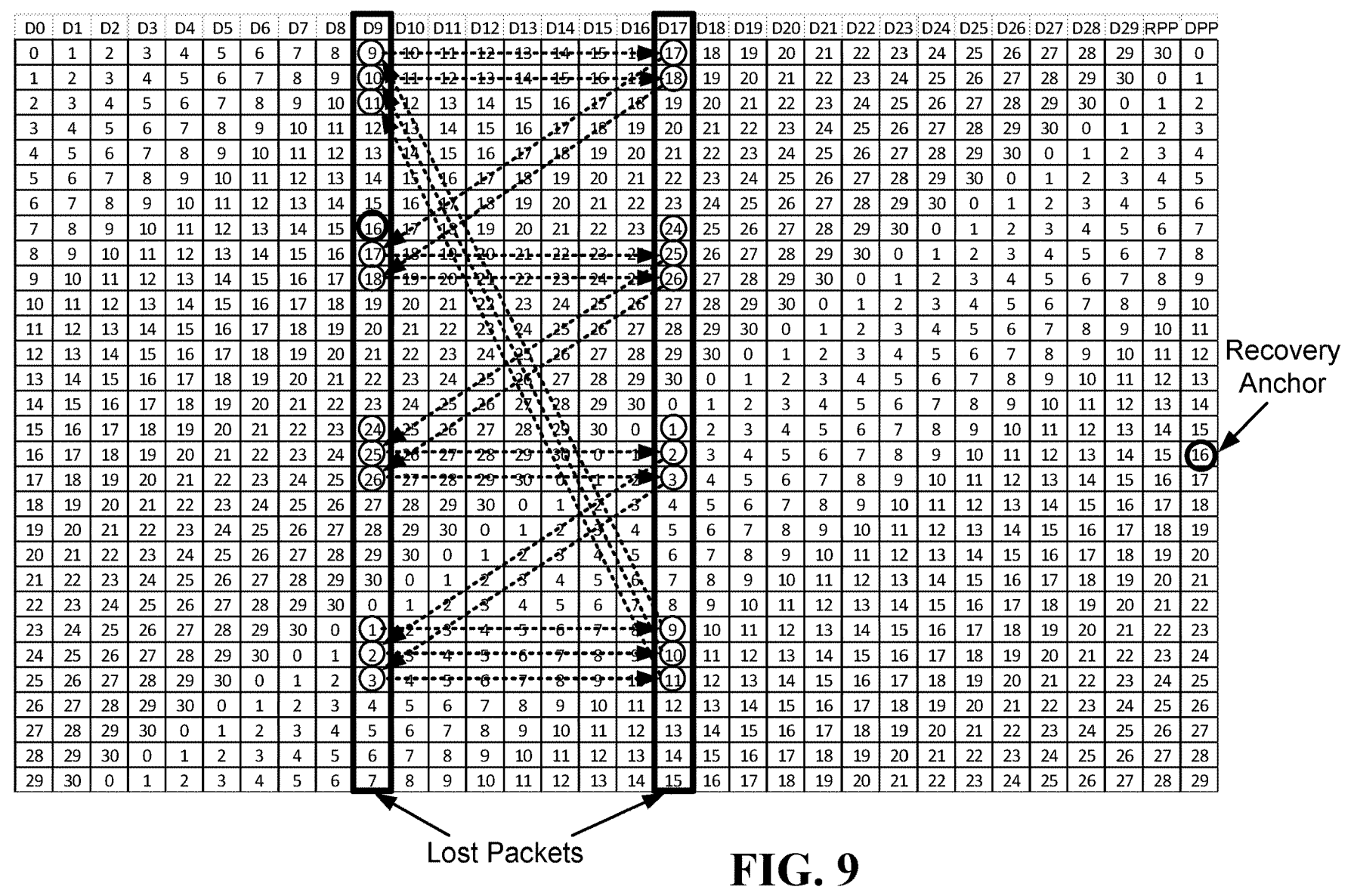

The remaining order of recovery, as illustrated in FIG. 8, is: [15,9], [15,17], [23,9], and [23,17]. FIG. 9 illustrates how the recovery continues in a similar fashion from [23,17] to [0,9](using diagonal parity set 9), and then in a similar fashion to the iterations described above: [0,17], [8,9], [8,17], [16,9], [16,17], [24,9], [24,17], [1,9], [1,17], [9,9], [9,17], [17,9], [17,17], [25,9], [25,17], and then to [2,9].

Figure 10:
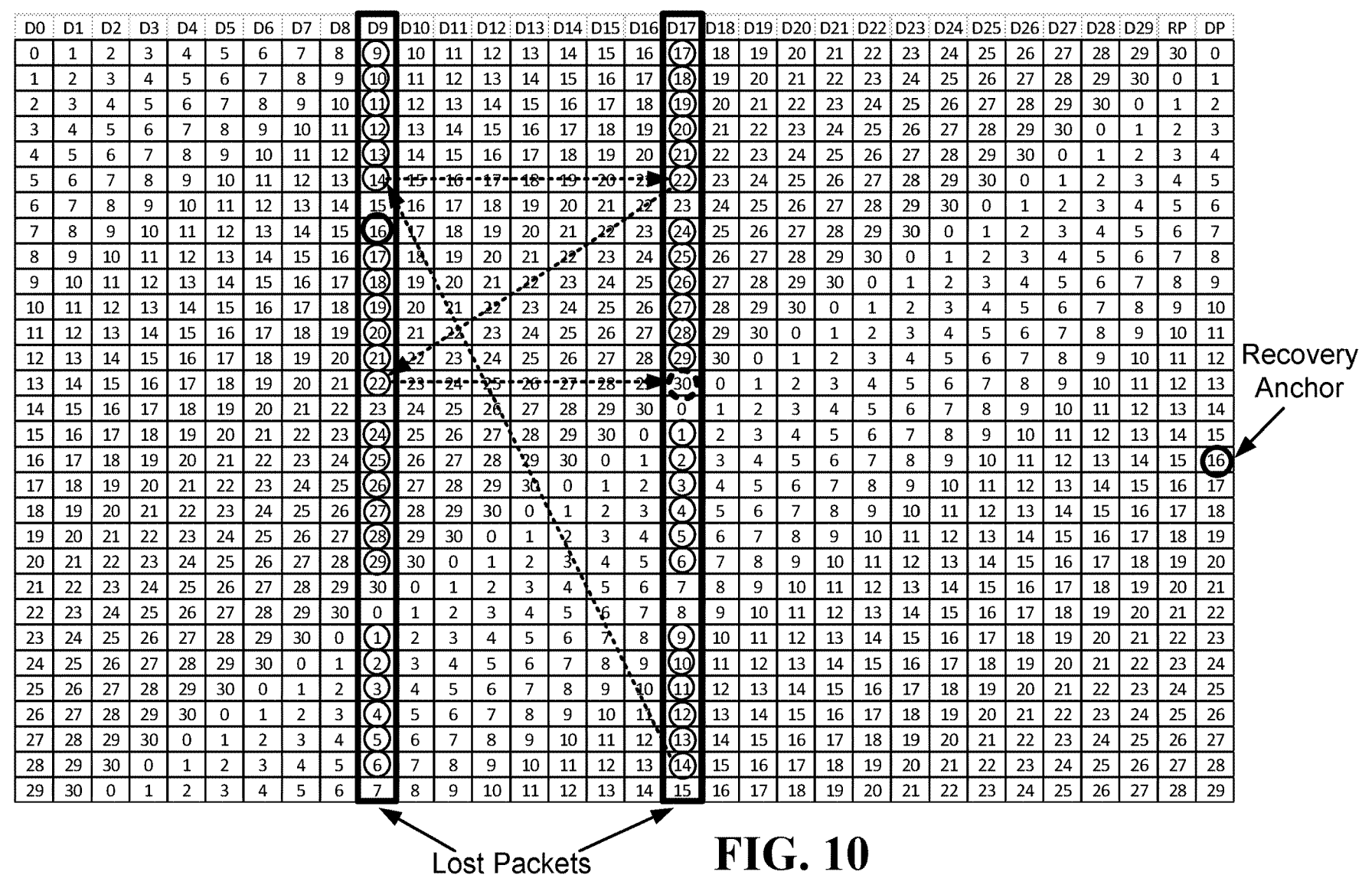

This recovery process continues, until the state described in FIG. 10, in which the recovery proceeds from [28,17] to [5,9], [5,17], [13,9] and then to [13,17], where it stops. The reason the recovery cannot continue from segment [13,17] is that [13,17] belongs to diagonal parity set 30, which is not stored in the packet DPP. Since DPP can only store 30 segments, results of one arbitrarily chosen diagonal parity set are not stored (in the illustrated tables the diagonal parity set number 30 is not stored, but in other examples, another diagonal parity set may be chosen to be excluded from DPP). Thus, at this stage recovery starting from the recovery anchor 16 is exhausted. However, there is another recovery anchor still available, recovery anchor 8.

Figure 11:
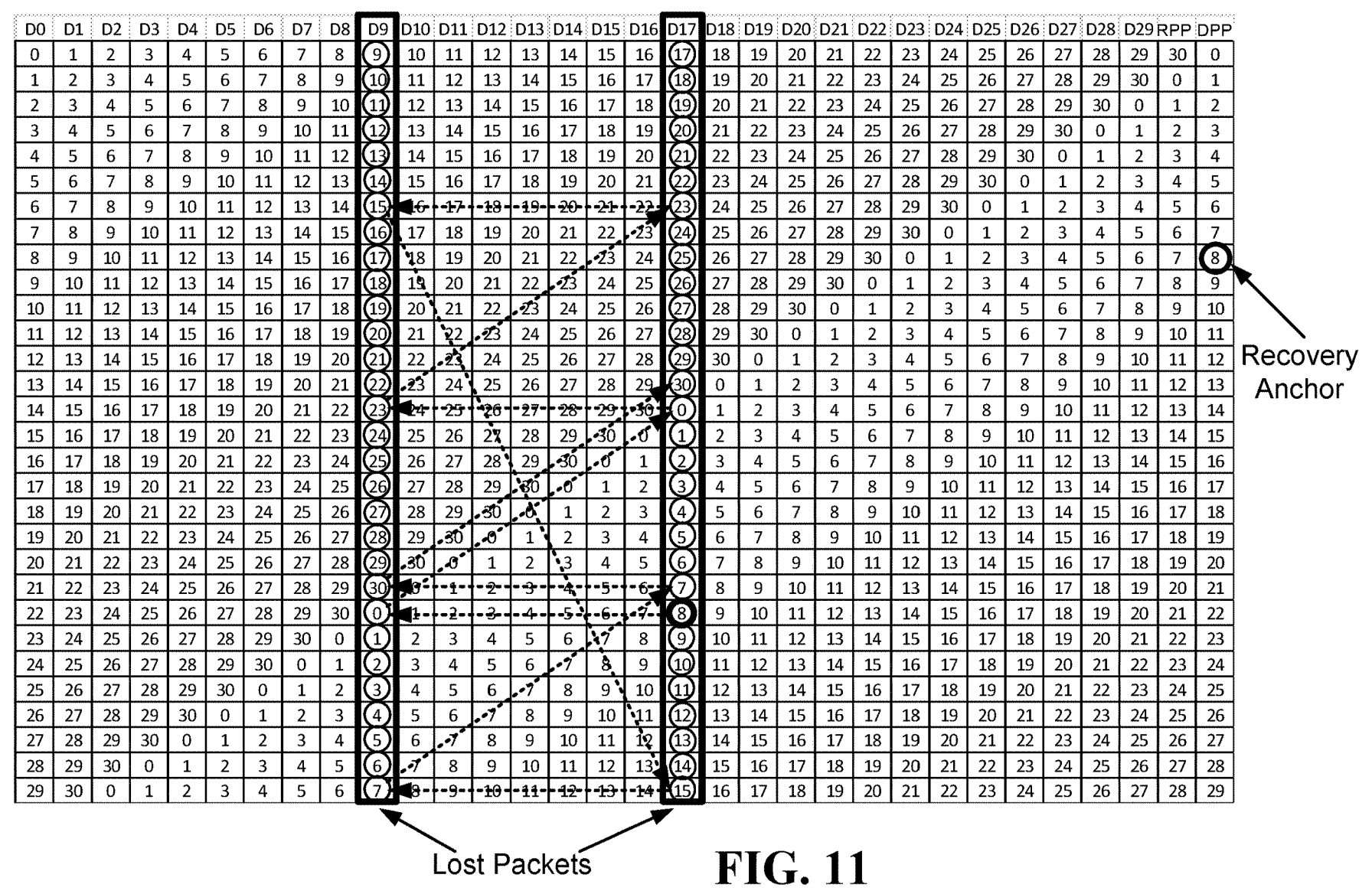

FIG. 11 illustrates the continued recovery of segments of the lost packets D7 and D9, using recovery anchor 8. The recovery starts with the segment [22,17] (i.e., the segment 22 of packet D17). Once segment [22,17] is recovered, there is only one segment on that row that is missing, segment [22,9] so it can be recovered based on the rest of the segments on that row. Thus, the recovery can continue in an iterative fashion, as described above. The order at which the segments are recovered in FIG. 11 is [22,17], [22,9], [14,17], [14,9], [6,17], [6,9], [29,17], [29,9], [21,17], and then [21,9]. At this stage, all segments in D9 and D17 have been recovered, to the recovery process terminates.

As discussed above, in some embodiments, an additional parity packet may be used, the anti-diagonal parity packet (ADPP). Optionally, each segment of ADPP comprises a result of a parity function applied to an anti-diagonal parity set comprising n segments, each belonging to a different packet selected from among the n packets 220 and RPP. Additionally, an intersection of each diagonal parity set and an anti-diagonal parity set includes at most one segment. Optionally, the processor 212 may utilize ADPP in a similar fashion to how it used DPP, as described above, which can enable it to recover up to 3 lost packets.

The FEC approach described above may be used with various types of communication networks such as wired networks and/or wireless networks. In some embodiments, the communication network 206 may be an Ethernet network. In one example, the communication network 206 may be an Ethernet network which is a virtual network that is obtained by slicing certain ports using Software-Defined Networking (SDN) and/or a virtual network obtained by dedicating bandwidth in a virtual local area network (VLAN). In yet another example, the communication network 206 may be an Ethernet network that is a virtual network obtained by any mean of slicing a sub-domain out of a bigger network. In still another example, the Ethernet network is a physical network fully dedicated for the HDBaseT® traffic delivery.

In one embodiment, the communication network 206 is an Ethernet network and the n packets 220 include packets with payloads of HDBaseT® T-packets belonging to an HDBaseT® session. For example, each packet from among the n packets 220 includes in its payload one or more HDBaseT® T-packets. When the FEC involves HDBaseT® traffic, certain values of n and certain segment sizes may be used to handle specific types of HDBaseT® traffic. In one example, the HDBaseT® traffic includes video, and the FEC is performed on blocks of n=30 packets, each including a payload that is a T-packet with a size of 390 bytes (or more) and includes a payload of video data (i.e., the T-packets is segmented to 30 segments of 33 bytes each). In another example, the HDBaseT® traffic includes audio data, and the FEC is performed with blocks of n=10 packets, each including a payload that is a T-packet with a size of 96 bytes (or more) that includes a payload of audio data. Optionally, the audio T-packets are segmented into 10 segments of 10 bytes (were some segments may optionally be padded with zeros to obtain 10×10 bytes of data). In yet another example, the HDBaseT® traffic includes video data, and the FEC is performed with blocks of n=10 packets, each including a payload that is a T-packet that has a size of 390 bytes (or more) with a payload of video, and the T-packet is segmented into 10 segments of 39 bytes. It is to be noted that in some embodiments, some portions of T-packets may not be protected by the FEC, such as certain fields in the header that are not essential to continue transmission of the T-packets, and thus may not be recovered when lost packets are recovered.

It is to be noted that utilization of blocks of n=30 packets for HDBaseT® transmissions of video data can achieve a desirable low overhead. In some embodiments involving HDBaseT® video transmission, to guarantee continuous and clean view of the received video signal, there is a need to recover those packets that the Ethernet switches are discarding. Ethernet links (1 GbE and above) can guarantee a BER (Bit-Error-Rate) of 10-12, while the end-to-end BER of the "clean signal" after recovery should be at least at the order of 10-16. Since the HDBaseT® is designed to deliver uncompressed video, most of the link is occupied with the video signal information, leaving ~7% overhead space for the redundancy information. Known prior art approaches to FEC, such as ST 2022-5:2013—SMPTE Standard—would incur a much higher overhead of (5+6)/(30+11)=26.8%, which is too high for some embodiments involving transmissions of uncompressed HD video in HDBaseT® sessions. However, probability calculations show that the ability to correct 2 packets in a FEC block of 32 packets (30 data packets and 2 parity packets) results with transmission overhead of 2/32=6.25% and performance of better than 10-16. Thus, n=30 may be a value suitable for some of the embodiments that involve HDBaseT® video traffic.

In one embodiment, an FPGA processor may be utilized to serially process packets and reconstruct up to two missing or erroneous packets in a block of packets using the FEC approach described above. Optionally, reconstructing the up to two missing or erroneous packets is done without having the entire data simultaneously stored in memory (e.g., in the buffer 216). That is, in the serial implementation, RPP and DPP are constructed at the side of the transmitter 204 based on the n packets 220, that flow serially byte after byte and packet after packet via the system. At the side of the receiver 214, RPP and DPP are serially accumulated and in case that a packet or two are lost, only RPP and DPP information is used to recover the missing packets, without a need to hold the entire information in memory. That is, in some implementations, the n−2 packets 222 and some of the parity data 208, need not all be entirely accessible at the same time at memory in order to perform recovery of one or two lost packets.

Figure 6A:
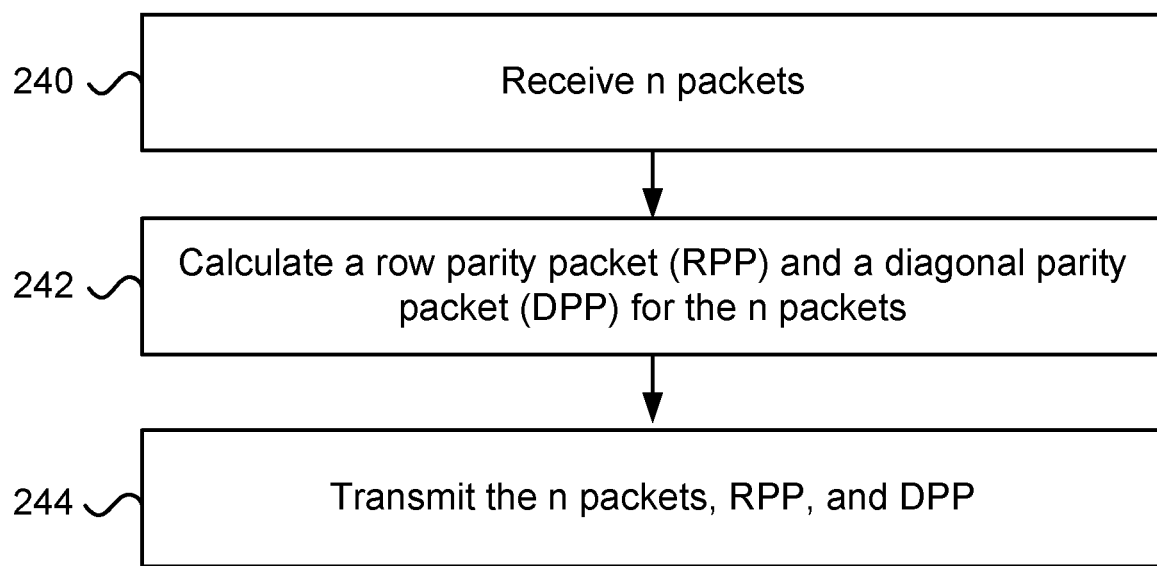
FIG. 6a illustrates one embodiment of method for enabling recovery of lost packets transmitted over a communication network.

FIG. 6a illustrates one embodiment of method for enabling recovery of lost packets transmitted over a communication network. In one embodiment the method includes at least the following steps:

In Step 240 receiving n packets. Optionally, the n packets are received by the processor 202.

In Step 242, calculating, by a processor (e.g., the processor 202), parity data for the n packets. Optionally, the parity data comprises a row parity packet (RPP) and a diagonal parity packet (DPP) for the n packets. Each of RPP, DPP, and the n packets comprises n segments. Additionally, calculating RPP and DPP utilizes each packet, from among the n packets, to update parity values in RPP and DPP in such a way that each segment in the packet is used to update one segment in RPP and at most one segment in DPP.

And in Step 244, transmitting, by a transmitter (e.g., the transmitter 204), the n packets, RPP, and DPP over the communication network. Optionally, one or more of the n packets are transmitted before updating the values of RPP and DPP based on one or more other packets from among the n packets. Optionally, segments of DPP are updated based on segments of RPP prior to transmitting DPP.

In one embodiment, the communication network is an Ethernet network and the n packets comprise HDBaseT® video T-packets belonging to an HDBaseT® session. Optionally, the method includes a step of segmenting the T-packets to 30 segments of 33 bytes. Additionally or alternatively, the method may include a step of segmenting T-packets of a size of 390 bytes or more that include a payload of video to 10 segments of 39 bytes and segmenting T-packets that have a size of 96 bytes or more that include a payload of audio to 10 segments of 10 bytes.

Figure 6B:
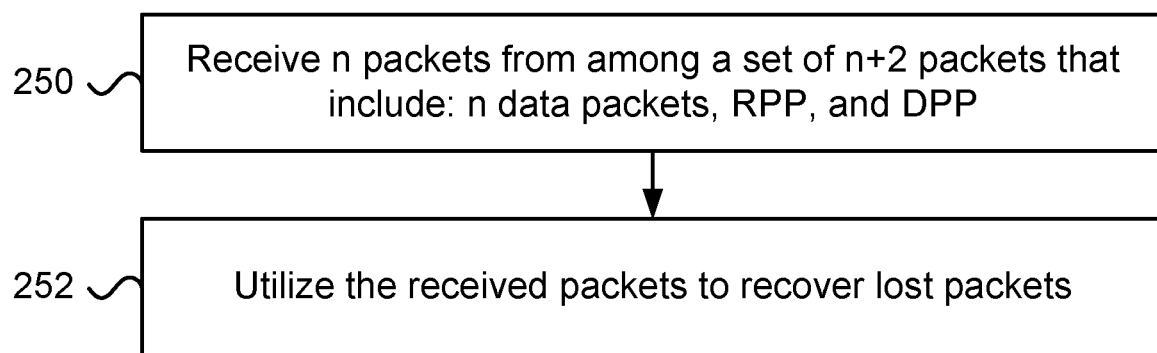
FIG. 6b illustrates one embodiment of method for recovering lost packets transmitted over a communication network.

FIG. 6b illustrates one embodiment of method for recovering lost packets transmitted over a communication network. In one embodiment, the method includes at least the following steps:

In Step 250, receiving, by a receiver, n packets (received packets) that belong to a set comprising n+2 packets transmitted over the communication network; the set comprises: n data packets, a row parity packet (RPP), and a diagonal parity packet (DPP). Each of the received packets comprises n segments. Each segment of RPP comprises a result of a parity function applied to a row parity set comprising n segments, each belonging to a different packet from among the n data packets. Additionally, each segment of DPP comprises a result of a parity function applied to a diagonal parity set comprising n segments, each belonging to a different packet selected from a group comprising the n data packets and RPP. Optionally, for each packet, from among the n data packets, DPP includes a segment calculated based on a diagonal parity set that does not include any of the segments of the packet.

And in Step 252, utilizing the received packets to recover packets, from among the set of n+2 packets transmitted over the communication network, that were not received by the receiver. Optionally, utilizing the received packets enables recovery of two packets from among the following packets: the n data packets, RPP, and DPP.

In one embodiment, recovering the packets is done by utilizing an iterative process to recover the values of the segments of two data packets, from among the n data packets, which were not received. Optionally, the iterative process involves performing the following until all segments of the two packets are recovered: (i) selecting a parity set, which has only a single segment that has yet to be recovered, from among the row parity sets used to calculate the segments of RPP or from among the diagonal parity sets used to calculate the segments of DPP, (ii) recovering the values of the single segment based on values of the rest of the segments belonging to the selected parity set.

In one embodiment, the set of packets transmitted over the communication network also includes an anti-diagonal parity packet (ADPP). Optionally, each segment of ADPP comprises a result of a parity function applied to an anti-diagonal parity set comprising n segments, each belonging to a different packet selected from among the n data packets and RPP. An intersection of each diagonal parity set and an anti-diagonal parity set includes at most one segment. In this embodiment, the method optionally includes a step of utilizing ADPP to recover up to 3 lost packets.

In one embodiment, the method optionally includes a step of storing the received packets in a buffer and evaluating the received packets to determine which packets were lost.

In one embodiment, the communication network is an Ethernet network and the received packets comprise HDBaseT® video T-packets belonging to an HDBaseT® session. Optionally, the method includes a step of segmenting the T-packets to 30 segments of 33 bytes. Additionally or alternatively, the method may optionally include a step of segmenting T-packets that comprise 390 bytes and include a payload of video to 10 segments of 39 bytes and segmenting T-packets that comprise 96 bytes and include a payload of audio to 10 segments of 10 bytes.

In some cases, packets may not be assumed to be contiguous. For example, with USB transmissions it may not be immediately apparent whether additional packets are to be transmitted (which will add up to a full block). The FEC approaches described above require accumulation of a full block of packets in order to perform FEC. However, if a full block of packets is not transmitted, the system may be in a waiting state until all the packets it is expecting are received, which can introduce unwanted delays and a lack of timely transmission of certain packets.

To overcome the limitation described above, some embodiments employ an adaptive parity approach, as described below. It is to be noted that while the description below involves the use of a single parity packet (PP), the teachings below may be extended to the use of multiple parity packets (e.g., RPP and DPP), as discussed in embodiments described above.

Figure 12:
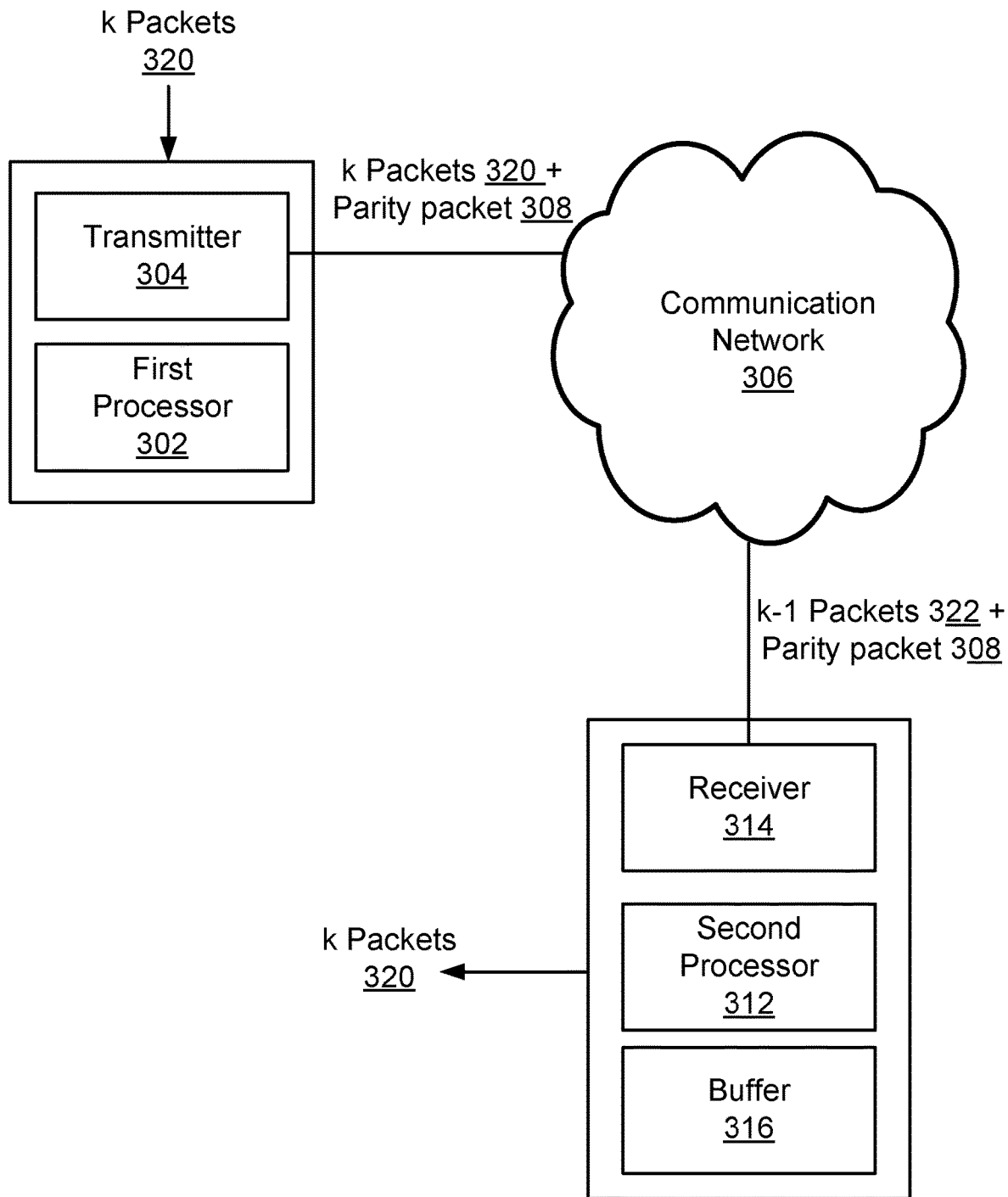
FIG. 12 illustrates an embodiment of a system configured to enable recovery of a lost packet from an incomplete block transmitted over a communication network.

FIG. 12 illustrates an embodiment of a system configured to enable recovery of a lost packet from an incomplete block transmitted over a communication network 306. The system includes at least a first processor 302, a transmitter 304, a second processor 312, and a receiver 314. The system may optionally include additional components such as a buffer 316.

The first processor 302 is configured to: receive a block of packets during a period spanning a certain duration, calculate a parity packet 308 for the block, and provide in the parity packet an indication of the number of packets in the block (which may be referred to as the size of the block). The certain duration is long enough to enable the first processor to receive at least n packets. Optionally, the received block includes k packets 320, where k<n. Some examples of values of n that may be used in embodiments include 9, 16, and 30. Optionally, the parity packet 308 includes the result of a parity function (e.g., an application of bitwise XOR operation) that is applied to the k packets 320. In one example, each of the k packets 320 includes n segments, and the parity packet 308 comprises n segments, and each segment of the parity packet 308 comprises a result of a parity function applied to a parity set comprising k segments, each belonging to a different packet from among the k packets 320.

The transmitter 304 transmits, over the communication network 306, the block of k packets 320 and the parity packet 308. Since once a packet is utilized in the calculation of the parity packet 308 it is not needed again for the parity calculations, there is no need to maintain a buffer sufficiently large to store n packets on the transmitter's end. Thus, in some embodiments, the transmitter 304 transmits one or more of the k packets 320, even before the first processor 302 finishes calculating the parity packet 308.

The receiver 314 receives, over a period that is not longer than the certain duration, packets sent by the transmitter 304. Optionally, the received packets include the parity packet 308 and at least some of the k packets 320.

The second processor 312 detects, based on a size indicated in the parity packet 308, whether the all of the transmitted packets were received. Responsive to identifying that k−1 packets were received (denoted k−1 packets 322), the second processor 312 may utilize the parity packet 308 along with the k−1 packets 322 to recover the lost packet. It is to be noted that even though a full block of n packets was not transmitted, the second processor 312 does not need to wait for a full block of n packets to arrive, nor does it need to wait for a period spanning the certain duration. Rather, in one embodiment, recovery of the lost packet commences less than the certain duration after the first packet, from among the k−1 packets 322 in the block, was received. Optionally, detection of the missing packet is done upon receiving the parity packet 308, which for a block of k<n can be at a time that is sooner than the certain duration after the first packet in the block is received. In some embodiments, the k−1 packets 322 are stored in the buffer 316, and the second processor 312 evaluates the stored packets in the buffer 316 to determine which packet was lost.

Figure 13:
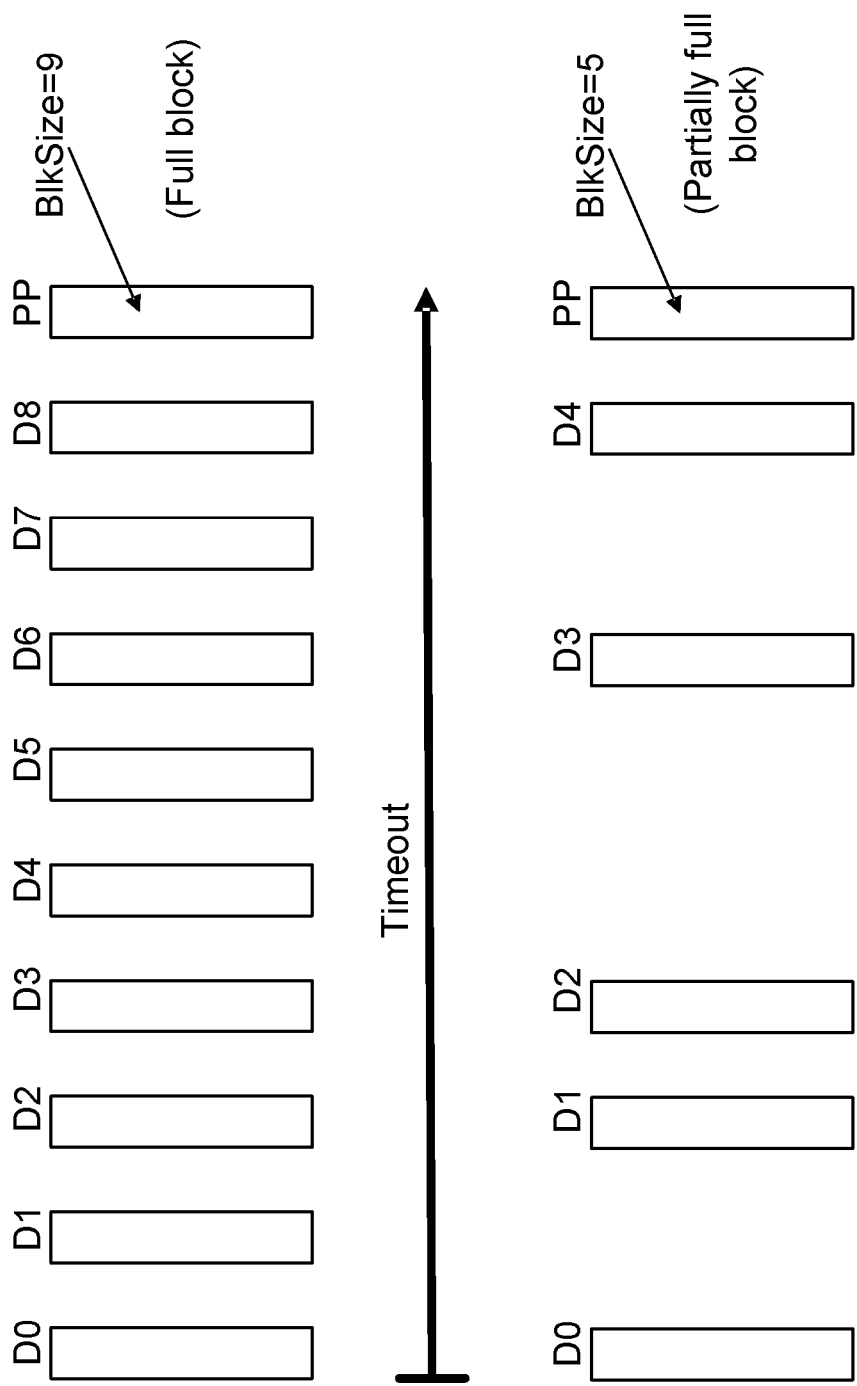
FIG. 13 illustrates examples of a timeout with a complete block of packets and with an incomplete block of packets.

The certain duration mentioned above may be considered a "timeout" period, as illustrated in FIG. 13. If a full block of n packets is received during the certain duration (the "timeout"), as illustrated in the top of FIG. 13, then the FEC is performed as is usually done with full blocks. However, if after the certain duration, only part of a block is received (e.g., 5 packets out of a full block of 9 packets in FIG. 13), then the size of the incomplete block is denoted in the parity block (PP in FIG. 13), and the accumulated parity packet is generated and sent along with the indication of the number of packets that had arrived (BlkSize=5 in FIG. 13). Thus, a recipient of the packets (which are not the full block of packets) does not need to wait indefinitely for the full block of packets to be transmitted and can process an incomplete block without delay. In this example, the information received in the incomplete block is sufficient to recover missing packet(s), when required.

It is to be noted that the FEC approach described above can be utilized to recover two or more lost packets. In one embodiment, the first processor 302 generates an additional parity packet for the k packets 320 (e.g., a diagonal parity packet described elsewhere in this disclosure). The transmitter 304 also transmits the additional parity packet over the communication network 306. The second processor 312 may utilize the additional parity packet to recover two lost packets from among the k packets (e.g., using the approach used by embodiments illustrated in FIG. 5).

The FEC approach described above for incomplete packets may be used with various types of communication networks such as wired networks and/or wireless networks. In some embodiments, the communication network 306 may be an Ethernet network. In one example, the communication network 306 may be an Ethernet network which is a virtual network that is obtained by slicing certain ports using Software-Defined Networking (SDN) and/or a virtual network obtained by dedicating bandwidth in a virtual local area network (VLAN). In yet another example, the communication network 306 may be an Ethernet network that is a virtual network obtained by any mean of slicing a sub-domain out of a bigger network. In still another example, the Ethernet network is a physical network fully dedicated for the HDBaseT® traffic delivery.

In one embodiment, the communication network 306 is an Ethernet network and the k packets 320 include packets with payloads of HDBaseT® T-packets belonging to an HDBaseT® session. Optionally, the k packets 320 include HDBaseT® T-packets with USB data. Optionally, the number of packets in a complete packet in this embodiment is 9 (i.e., a complete block size of n=9).

Figure 14:
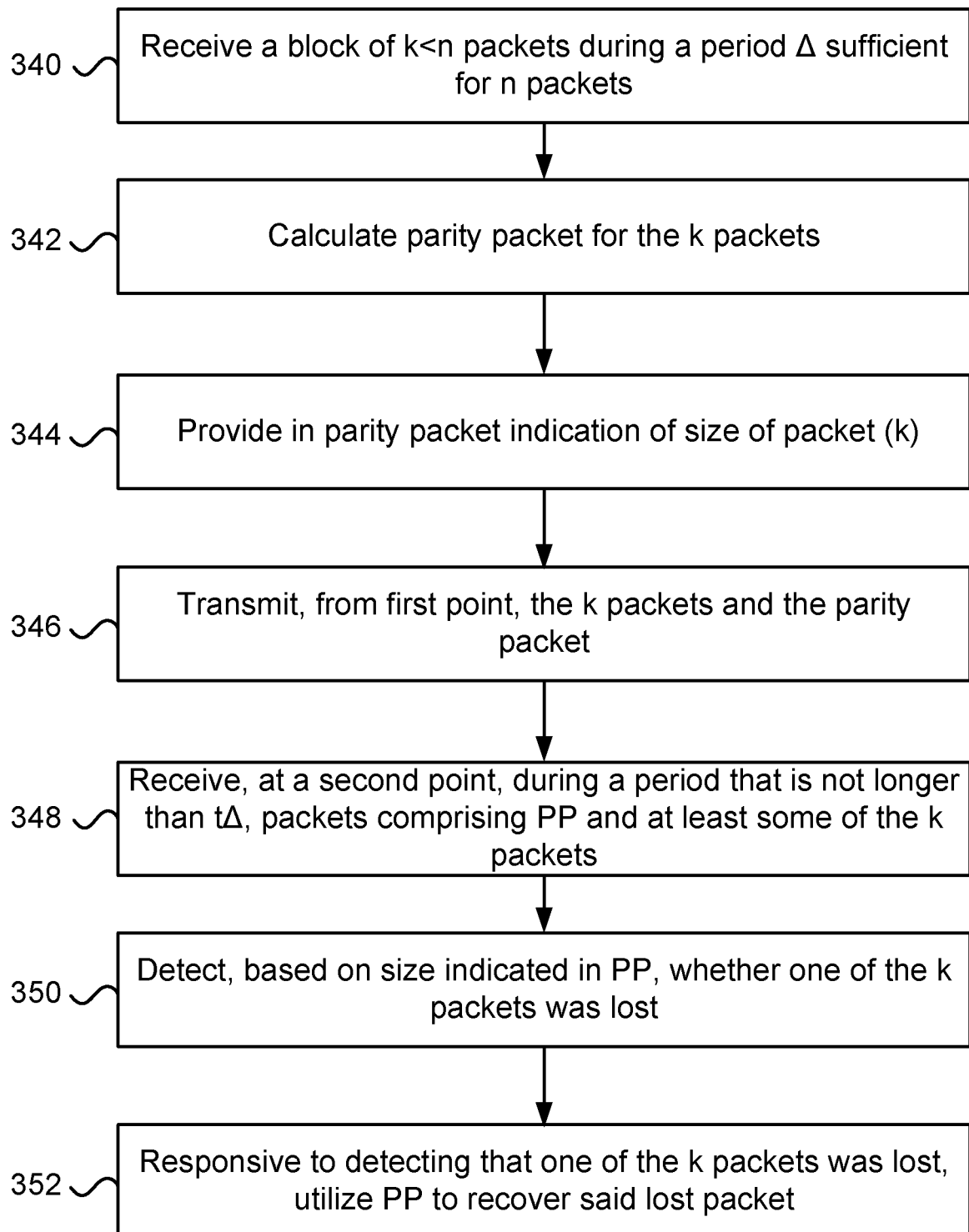
FIG. 14 illustrates an embodiment of a method for recovery of a lost packet from an incomplete block transmitted over a communication network.

FIG. 14 illustrates an embodiment of a method for recovery of a lost packet from an incomplete block transmitted over a communication network. In one embodiment, the method includes at least the following steps:

In Step 340, receiving, at a first point, a block of packets during a period spanning a certain duration. The block comprises k<n packets, and the certain duration is long enough for receiving at least n packets. Optionally, n=9 and the k packets comprise HDBaseT® T-packets with USB data.

In Step 342, calculating a parity packet (PP) for the block.

In Step 344, providing in PP an indication of the number of packets in the block (size), which is the value of k.

In Step 346, transmitting, from the first point, over a communication network, the k packets and PP. Optionally, one or more of the k packets is transmitted before terminating calculation of PP.

In Step 348, receiving, at a second point, during a period that is not longer than the certain duration, packets comprising PP and at least some of the k packets.

In Step 350, detecting, based on the size indicated in PP, whether one of the k packets was lost.

And in Step 352, responsive to detecting that one of the k packets was lost, utilizing PP to recover said lost packet. Optionally, recovering the lost packet starts less than the certain duration after the first packet, from among the k−1 packets in the block, was received.

In one embodiment, the communication network is an Ethernet network, which is a virtual network. Optionally, the method includes a step of slicing certain ports using Software-Defined Networking (SDN) to obtain the Ethernet network. Additionally or alternatively, the method may include a step of dedicating bandwidth in a virtual local area network (VLAN) to obtain the Ethernet network. Additionally or alternatively, the method may include a step of slicing a sub-domain out of a bigger network to obtain the Ethernet network.

In one embodiment, the method optionally includes steps that include: generating an additional parity packet for the k packets, transmitting the additional parity packet over the communication network, and utilizing the additional parity packet to recover two lost packets from among the k packets.

The elements used by the embodiments may be implemented in various ways. A "processor" may refer to one or more of the following components: a general-purpose processing device, a microprocessor, a central processing unit, a complex instruction set computing (CISC) microprocessor, a reduced instruction set computing (RISC) microprocessor, an application specific integrated circuit (ASIC), a field programmable gate array (FPGA), a digital signal processor (DSP), and/or a network processor.

Elements such as switches, transmitters, and receivers may be implemented utilizing a combination that includes one or more of the following hardware, firmware, and software elements: ASIC, FPGA, processors, memory blocks, discrete circuits, integrated circuits, at least one processor to execute commands stored in at least one memory block, a non-transitory computer-readable medium comprising computer-executable instructions that when executed on a computing device cause the computing device to perform certain operations, a processor and a computer readable storage medium comprising a program of instructions executable by the processor wherein when the instructions are executed the processor perform certain operations, a computer system comprising one or more processing units and memory storing one or more programs configured for execution by the one or more processors units wherein the one or more programs include instructions for certain operations, a system comprising a data processing apparatus and a non-transitory computer readable medium storing instructions executable by the data processing apparatus and that upon such execution cause the data processing apparatus to perform certain operations. Buffers may be implemented using memory to store the data, and processor to access the data over a communication channel, such as a parallel bus or a serial bus.

In this description, references to "one embodiment" mean that the feature being referred to may be included in at least one embodiment of the invention. Moreover, separate references to "one embodiment" or "some embodiments" in this description do not necessarily refer to the same embodiment. Additionally, references to "one embodiment" and "another embodiment" may not necessarily refer to different embodiments, but may be terms used, at times, to illustrate different aspects of an embodiment.

The embodiments of the invention may include any variety of combinations and/or integrations of the features of the embodiments described herein. Although some embodiments may depict serial operations, the embodiments may perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. The embodiments are not limited in their applications to the details of the order or sequence of steps of operation of methods, or to details of implementation of devices, set in the description, drawings, or examples. Moreover, individual blocks illustrated in the figures may be functional in nature and therefore may not necessarily correspond to discrete hardware elements.

While the methods disclosed herein have been described and shown with reference to particular steps performed in a particular order, it is understood that these steps may be combined, sub-divided, and/or reordered to form an equivalent method without departing from the teachings of the embodiments. Accordingly, unless specifically indicated herein, the order and grouping of the steps is not a limitation of the embodiments. Furthermore, methods and mechanisms of the embodiments will sometimes be described in singular form for clarity. However, some embodiments may include multiple iterations of a method or multiple instantiations of a mechanism unless noted otherwise. For example, when a processor is disclosed in one embodiment, the scope of the embodiment is intended to also cover the use of multiple processors. Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination. Embodiments described in conjunction with specific examples are presented by way of example, and not limitation. Moreover, it is evident that many alternatives, modifications, and variations will be apparent to those skilled in the art. It is to be understood that other embodiments may be utilized and structural changes may be made without departing from the scope of the embodiments. Accordingly, this disclosure is intended to embrace all such alternatives, modifications, and variations that fall within the spirit and scope of the appended claims and their equivalents.

We claim:

1. A system configured to provide a virtual HDBaseT link, comprising:
   a first switch configured to transmit packets over an Ethernet network that comprises one or more hops that do not implement a transparent clock; wherein a payload of each of the packets comprises a packet belonging to an HDBaseT session (T-packet);
   a first processor configured to set, for each packet from among a plurality of the packets, a timestamp value in the packet to correspond to a time at which the packet is transmitted by the first switch;
   a second switch configured to receive the packets over the Ethernet network; and
   a second processor configured to: calculate a clock correction value based on timestamps in the plurality of the packets, and utilize the clock correction value to perform at least one of the following: (i) control transmission, by the second switch, of data comprised in T-packets comprised in the payloads of the packets, and (ii) recover a source clock of native media delivered over the Ethernet network.

2. The system of claim 1, wherein a payload of each packet among the plurality of the packets comprises an HDBaseT clock measurement T-packet and the timestamp is written in a region of the payload that does not overlap with the clock measurement T-packet.

3. The system of claim 1, wherein the one or more hops do not implement a Synchronous Ethernet (SyncE) mechanism.

4. The system of claim 1, wherein the clock correction value is indicative of a clock frequency offset between a local clock of the second switch and a frequency of a reference clock of a source of the HDBaseT session.

5. The system of claim 4, wherein the second switch is configured to transmit the T-packets on an additional HDBaseT link, and the second processor is further configured to update a frequency offset ("FreqOffset") field of transmitted clock measurement T-packets based on the clock correction value.

6. The system of claim 4, wherein the packets transmitted by the first switch comprise HDBaseT T-packets belonging to multiple HDBaseT sessions, and the second processor is configured to calculate multiple clock correction values corresponding to the multiple HDBaseT sessions, with each clock correction value corresponding to a certain HDBaseT session being indicative of a clock frequency offset between the local clock of the second switch and a frequency of a reference clock of a source of the certain HDBaseT session.

7. The system of claim 1, wherein the clock correction value is indicative of a latency of transmission of packets over the Ethernet network.

8. The system of claim 1, wherein the Ethernet network is a physical network fully dedicated for the HDBaseT traffic delivery.

9. The system of claim 1, wherein the Ethernet network is a virtual network that is obtained by slicing certain ports using Software-Defined Networking (SDN).

10. The system of claim 1, wherein the Ethernet network is a virtual network obtained by dedicating bandwidth in a virtual local area network (VLAN).

11. The system of claim 1, wherein the Ethernet network is a virtual network obtained by slicing a sub-domain out of a bigger network.

12. The system of claim 1, wherein a packet whose payload comprises a T-packet with video data is transmitted over the Ethernet network with a lower priority than a packet whose payload comprises a clock measurement T-packet.

13. The system of claim 1, wherein the second processor is configured to calculate the clock correction value based on multiple pairs of timestamps (TS, TR), where TS corresponds to the time at which a packet was transmitted by the first switch and TR corresponds to a time at which the packet was received by the second switch.

14. The system of claim 13, wherein the clock correction value is indicative of an average of differences TR−TS of the multiple pairs.

15. The system of claim 13, wherein the clock correction value corresponds to a time t, and is calculated using a function f(t), whose parameters are determined based the values of the multiple pairs of timestamps (TS, TR).

16. The system of claim 13, further comprising multiple windows of time, each comprising multiple pairs of timestamps (TS, TR); wherein the second processor is further configured to calculate multiple clock correction values, each corresponding to a different window of time.

17. The system of claim 1, wherein the second processor is further configured to control transmission of the data comprised in the T-packets such that the data is transmitted in a manner that maintains one or more of the following: (i) latency between when a T-packet is received by the first switch and when it is transmitted by the second switch is below a threshold, and the threshold is below 100 μs; and (ii) the clock correction value is indicative of a frequency offset within ±100 parts per million (PPM) between a local clock of the second switch and a reference clock of a source of the HDBaseT session.

18. The system of claim 17, wherein the T-packets comprise certain T-packets comprising at least one of: HDMI audio/video T-packets, and USB T-packets; and wherein transmitting the data comprised in the T-packets in the manner that complies with the HDBaseT standard involves transmitting the certain T-packets, by the second switch, in the same order in which the certain T-packets were received by the first switch.

19. The system of claim 1, further comprising a buffer configured to store the T-packets in the payloads of the packets received by the second switch; wherein the second processor is configured to utilize the clock correction value to determine when to transmit the T-packets, over an HDBaseT link, in order to maintain a certain order of transmission of the T-packets and a certain delay between when successive T-packets are transmitted.

20. The system of claim 1, further comprising a buffer configured to store data in the payloads of the packets received by the second switch; wherein at least some of the data comprises uncompressed video, and the second processor is configured to utilize the clock correction value to recreate a native clock that controls release of pixel data of the uncompressed video to a video adapter.

21. A method for providing a virtual HDBaseT link, comprising:
transmitting, by a first switch, packets over an Ethernet network that comprises one or more hops that do not implement a transparent clock; wherein a payload of each of the packets comprises a packet belonging to an HDBaseT session (T-packet);
setting for each packet from among a plurality of the packets, a timestamp value in the packet to correspond to a time at which the packet will be transmitted;
receiving, by a second switch, the packets over the Ethernet network;
calculating a clock correction value based on timestamps in the plurality of the packets; and
utilizing the clock correction value to perform at least one of the following: (i) control transmission, by the second switch, of data comprised in T-packets comprised in the payloads of the packets, and (ii) recover a source clock of native media delivered over the Ethernet network.

22. The method of claim 21, wherein a payload of each packet among the plurality of the packets comprises an HDBaseT clock measurement T-packet and further comprising writing the timestamp in a region of the payload that does not overlap with the clock measurement T-packet.

23. The method of claim 21, further comprising calculating a clock frequency offset between a local clock of the second switch and a frequency of a reference clock of a source of the HDBaseT session.

24. The method of claim 23, further comprising transmitting, by the second switch, the T-packets on an additional HDBaseT link and updating a frequency offset ("FreqOffset") field of transmitted clock measurement T-packets based on the clock frequency offset.

25. The method of claim 23, wherein the packets transmitted by the first switch comprise HDBaseT T-packets belonging to multiple HDBaseT sessions, and further comprising calculating multiple clock correction values corresponding to the multiple HDBaseT sessions, with each clock correction value corresponding to a certain HDBaseT session being indicative of a clock frequency offset between the local clock of the second switch and a frequency of a reference clock of a source of the certain HDBaseT session.

26. The method of claim 21, further comprising calculating latency of transmission of packets over the Ethernet network.

27. The method of claim 21, wherein the Ethernet network is a virtual network and further comprising slicing certain ports using Software-Defined Networking (SDN) to obtain the Ethernet network.

28. The method of claim 21, wherein the Ethernet network is a virtual network and further comprising dedicating bandwidth in a virtual local area network (VLAN) to obtain the Ethernet network.

29. The method of claim 21, wherein Ethernet network is a virtual network and further comprising slicing a subdomain out of a bigger network to obtain the Ethernet network.

30. The method of claim 21, further comprising transmitting a packet whose payload comprises a T-packet with video data with a lower forwarding priority than a packet whose payload comprises a clock measurement T-packet.

31. The method of claim 21, further comprising calculating the clock correction value based on multiple pairs of timestamps (TS, TR), where TS corresponds to the time at which a packet was transmitted by the first switch and TR corresponds to a time at which the packet was received by the second switch.

32. The method of claim 21, further comprising controlling transmission of data comprised in the T-packets such that the data is transmitted in a manner that complies with the HDBaseT standard, which involves maintaining one or more of the following: (i) latency between when a T-packet is received by the first switch and when it is transmitted by the second switch is below a threshold, and the threshold is below 100 µs; and (ii) the clock correction value is indicative of a frequency offset within ±100 parts per million (PPM) between a local clock of the second switch and a reference clock of a source of the HDBaseT session.

33. The method of claim 21, further comprising determining based on the clock correction value when to transmit the T-packets, over an additional HDBaseT link, in order to maintain a certain order of transmission of the T-packets and a certain delay between when successive T-packets are transmitted.

34. The method of claim 21, further comprising storing data in the payloads of the packets received by the second switch, which comprises uncompressed video, in a buffer and utilizing the clock correction value to recreate a native clock that controls release of pixel data of the uncompressed video to a video adapter.

* * * * *